US010497765B2

(12) United States Patent
Chen et al.

(10) Patent No.: US 10,497,765 B2
(45) Date of Patent: Dec. 3, 2019

(54) ORGANIC LIGHT-EMITTING DISPLAY PANEL AND DISPLAY APPARATUS THEREOF

(71) Applicant: Shanghai Tianma Micro-Electronics Co., Ltd., Shanghai (CN)

(72) Inventors: Haijing Chen, Shanghai (CN); Ming Yang, Shanghai (CN); Yingteng Zhai, Shanghai (CN); Guofeng Zhang, Wuhan (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/107,035

(22) Filed: Aug. 21, 2018

(65) Prior Publication Data

US 2019/0237524 A1 Aug. 1, 2019

(30) Foreign Application Priority Data

Jan. 31, 2018 (CN) .......................... 2018 1 0096022

(51) Int. Cl.
*H01L 27/32* (2006.01)
*H01L 51/52* (2006.01)

(52) U.S. Cl.
CPC ...... *H01L 27/3246* (2013.01); *H01L 51/5206* (2013.01); *H01L 51/5221* (2013.01); *H01L 51/5237* (2013.01)

(58) Field of Classification Search
CPC ........................................ H01L 27/3244–3279
See application file for complete search history.

(56) References Cited

U.S. PATENT DOCUMENTS

| 2011/0163318 A1* | 7/2011 | Park | H01L 27/3246 257/59 |
| 2014/0110701 A1* | 4/2014 | Noh | H01L 27/3211 257/43 |
| 2015/0060820 A1* | 3/2015 | Takagi | H01L 51/5218 257/40 |
| 2018/0061904 A1* | 3/2018 | Shim | H01L 27/3206 |

FOREIGN PATENT DOCUMENTS

| CN | 103779380 A | 5/2014 |
| CN | 104638147 A | 5/2015 |

* cited by examiner

*Primary Examiner* — Daniel P Shook
(74) *Attorney, Agent, or Firm* — Anova Law Group, PLLC

(57) ABSTRACT

An organic light-emitting display panel and a display apparatus are provided. An exemplary organic light-emitting display panel includes a substrate; an array layer disposed on the substrate and a display layer disposed on the array layer. The display layer includes an anode layer, a pixel definition layer having a plurality of the openings exposing the anode layer, an organic light-emitting material layer filled in the openings and connecting with the anode layer, and a cathode layer disposed on the organic light-emitting layer. The plurality of openings of the pixel definition layer includes a plurality of first openings and a plurality of second openings. Along a direction perpendicular to the organic light-emitting display panel, a height of a sidewall of at least a portion of a first opening is greater than a height of a sidewall of a second opening.

19 Claims, 11 Drawing Sheets

ORGANIC LIGHT-EMITTING DISPLAY PANEL AND DISPLAY APPARATUS THEREOF

CROSS-REFERENCES TO RELATED APPLICATIONS

This application claims priority of Chinese Patent Application No. 201810096022.0, filed on Jan. 31, 2018, the entire contents of which are hereby incorporated by reference.

FIELD OF THE DISCLOSURE

The present disclosure generally relates to the field of display technology and, more particularly, relates to an organic light-emitting display panel and a display apparatus thereof.

BACKGROUND

With the continuous development of display technologies, the manufacturing of display panels has become more and more mature. Display panels include organic light-emitting diode (OLED) display panels, and liquid-crystal display panels (LCDs), etc. OLED display panels are featured with self-emitting light, wide viewing angle, low power consumption and ultrafast response speed, etc. and thus, have been widely used in the display field.

In existing technologies, the pixel structure of an OLED display panel is a layered-structure including an anode, an organic light-emitting material layer and a cathode. The lights emitted from the organic light-emitting material layer in different pixels show different colors. Thus, different pixels emit light with different colors, and pixels emitting light in different colors form an image. However, as the properties of light in different colors vary, the change scales of the brightness of the light emitted from pixels with different colors at large viewing angles are different. Thus, the OLED display panel at the large viewing angles may experience brightness and color variations at large viewing angles, and the color shift may also be severe.

The disclosed organic light-emitting display panel and display apparatus are directed to solve one or more problems set forth above and other problems in the art.

BRIEF SUMMARY OF THE DISCLOSURE

One aspect of the present disclosure provides an organic light-emitting display panel. The organic light-emitting display panel includes a substrate; an array layer disposed on the substrate, wherein the array layer has a first surface connecting with the substrate and an opposing second surface; and a display layer disposed on the second surface of the array layer. The display layer comprises an anode layer having a first surface connecting with the second surface of the array layer and an opposing second surface, a pixel definition layer having a plurality of the openings exposing the anode layer and disposed on the second surface of the array layer, an organic light-emitting material layer filled in the plurality of openings and connecting with the anode layer and a cathode layer disposed on a side of the organic light-emitting material layer away from the array layer. An opening of the plurality of opening of the pixel definition layer includes a plurality of first openings and a plurality of second openings; the organic light-emitting material layer filled in a first opening of the plurality of first opening is configured to emit a light of a first color; the organic light-emitting material layer filling in a second opening of the plurality of second opening is configured to emit a light of a second color; a wavelength of the light of the first color is greater than a wavelength of the light of the second color; and along a direction perpendicular to the organic light-emitting display panel, a height of a sidewall of at least a portion of the first opening is greater than a height of a sidewall of the second opening.

Another aspect of the present disclosure provides a display apparatus. The display apparatus includes an organic light-emitting display panel. The organic light-emitting display panel includes a substrate; an array layer disposed on the substrate, wherein the array layer has a first surface connecting with and an opposing second surface; and a display layer disposed on the second surface of the array layer. The display layer comprises an anode layer having a first surface connecting with the second surface of the array layer and an opposing second surface, a pixel definition layer having a plurality of openings exposing the anode layer and disposed on the second surface of the array layer, an organic light-emitting material layer filled in the openings and connecting with the anode layer and a cathode layer disposed on a side of the organic light-emitting material layer away from the array layer. An opening of the pixel definition layer includes a plurality of first openings and a plurality of second openings; the organic light-emitting material layer filling in a first opening is configured to emit a light of a first color; the organic light-emitting material layer filling in a second opening is configured to emit a light of a second color; a wavelength of the light of the first color is greater than a wavelength of the light of the second color; and along a direction perpendicular to the organic light-emitting display panel, a height of sidewall of at least a portion of the first opening is greater than a height of a sidewall of the second opening.

Other aspects of the present disclosure can be understood by those skilled in the art in light of the description, the claims, and the drawings of the present disclosure.

DETAILED DESCRIPTION

Figure 1:
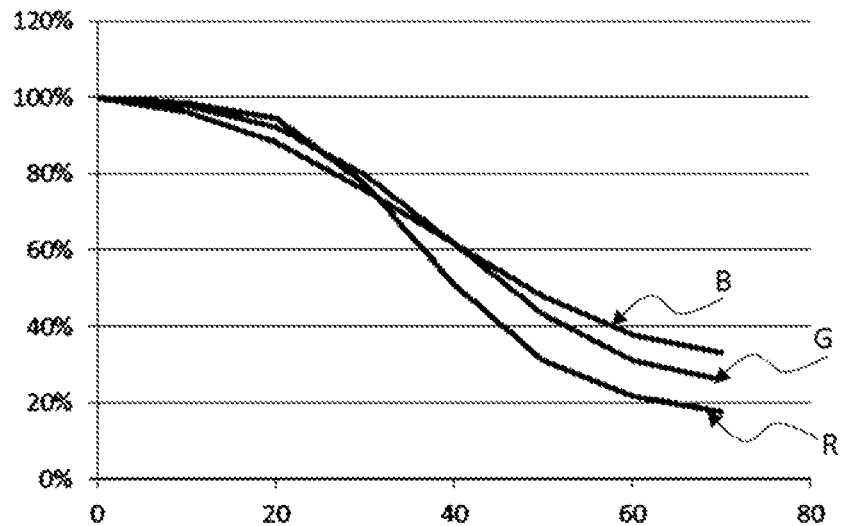
FIG. 1 illustrates a viewing angle dependent brightness of an existing organic light-emitting display panel.

To allow the above-described objects, features and advantages of the present disclosure to be more apparent, the present disclosure will be further described in detail with accompanying drawings and specific embodiments.

In the following descriptions, the specific details are described in order to fully understand the present disclosure. However, the present disclosure can be a variety of other ways different from the embodiments described herein. The persons of ordinary skill in the art can do similar modifications without departing from the purposes of the present disclosure. Therefore, the present disclosure is not limited to the particular embodiments disclosed below.

The terms used in the disclosed embodiments are merely for the purpose of describing particular embodiments, are not intended to limit the present disclosure. In the disclosed embodiments of the present disclosure and the appended claims, the singular form of word, such as "a", "the" and "such a", etc., are intended to include the plural forms unless the context clearly indicates otherwise.

It is noted that the position word, such as "on", "under", "left", and "right", etc., are described according to the angle shown in the drawings; and should not be considered as the limitations of the present disclosure. Further, in context, it should be also understood that, when referring to an element is formed "on" another element or "under" another element, which can not only be formed directly "on" another element or "under" another element, it can be indirectly formed "on" or "under" another element through an intermediate element.

To allow the above-described objects, features and advantages of the present disclosure to be more apparent, the present disclosure will be further described in detail with the accompanying drawings and the following specific embodiments. However, the exemplary embodiments can be implemented in various forms and should not be construed as a limitation to the embodiments set forth herein. Rather, these embodiments are provided such that the present disclosure will be thorough and complete, and the concept of the exemplary embodiments will be fully conveyed to those skilled in the art. In the drawings, the same reference numerals denote the same or similar structure. Therefore, the repeated description thereof will be omitted. The words of position and orientation described in the present disclosure are based on the accompany drawings. However, it may be changed according to the practical needs. The changes may be included within the scope of the present disclosure. The accompanying drawings are only for illustration of the relative position. The thickness of some parts are illustrated with an exaggerated manner to facilitate the understanding of the drawing. The thickness in the drawing does not represent the actual ratio among the thicknesses of different. In the case of no conflict, the disclosed embodiments and features of the disclosed embodiments can be combined with each other. Wherever possible, the same reference numbers will be used throughout the drawings to refer to the same or like parts. The similar portions of different embodiments may not be repeated.

FIG. 1 illustrates a viewing angle dependent brightness of an existing organic light-emitting display panel. As shown in FIG. 1, the ordinate denotes the brightness percentage (i.e., the light emitted by the pixels of different colors), and the abscissa denotes the viewing angle (based on the perpendicular viewing angle). The curves labeled with R, G, and B are the viewing angle dependent brightness of red light, green light, and blue light, respectively. The experimental data suggests that the red light decays faster as the viewing angle increases, while the blue light decays slower as the viewing angle increases. The change rate of the viewing angle dependent brightness of the red light and the change rate of the viewing angle dependent brightness of the blue light are significantly different in the small viewing angle range and the large viewing angle range. Thus, at the large viewing angle range, the blue light occupies a larger portion of the emitted light, and the red light occupies a smaller portion of the emitted light. Accordingly, the white screen observed at a perpendicular/normal viewing angle may show a blue tone when observed at the large viewing angle range.

Figure 2:
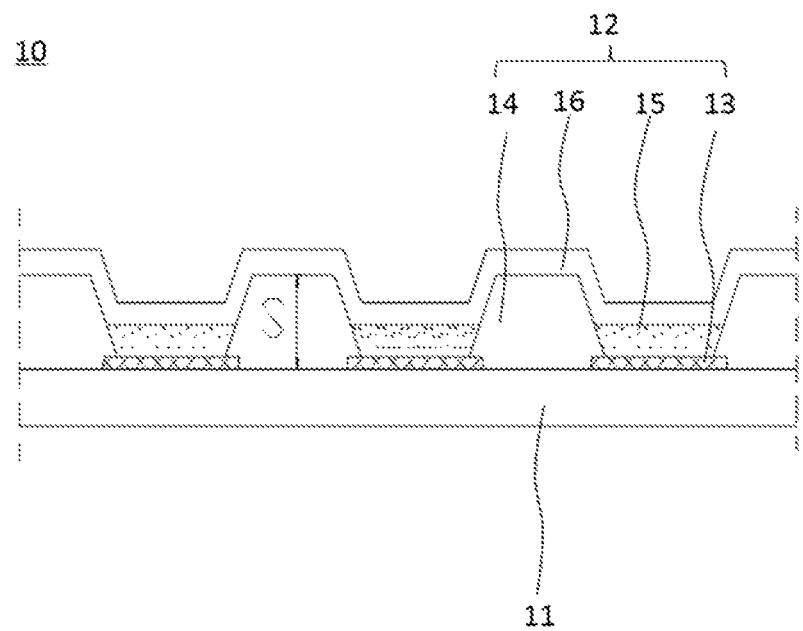
FIG. 2 illustrates an existing organic light-emitting display panel.

FIG. 2 illustrates an existing organic light-emitting display panel. As illustrated in FIG. 2, the existing organic light-emitting display panel 10 includes an array substrate 11, and a light-emitting function layer 12 disposed on the array substrate 11. The light-emitting function layer 12 includes an anode 13 disposed on the array substrate 11, and a pixel definition layer 14 disposed on the anode 13. The pixel definition layer 14 has a certain thickness and includes at least one opening exposing the anode 13. The light-emitting function layer 12 also includes an organic light-emitting material layer 15 filled in the opening of the pixel definition layer 14, and a cathode 16 covering the organic light-emitting material layer 15. The anode 13, the organic light-emitting material layer 15, and the cathode 16 together form an organic light-emitting diode (OLED). One pixel of the display panel 10 includes one OLED.

At the large viewing angle, light of different wavelengths (i.e., light emitted by pixels of different colors) are affected differently by the pixel definition layer 14. For illustrative purposes, red light with a longer wavelength and blue light with a shorter wavelength are taken as examples for further explanation.

Figure 3:
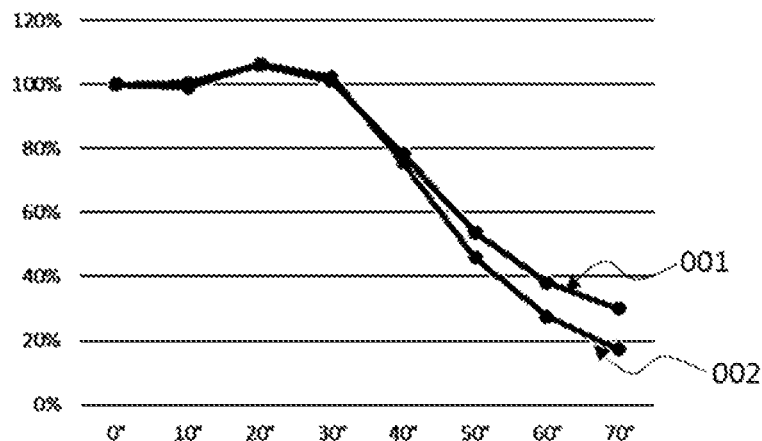
FIG. 3 illustrates a comparison between a viewing angle dependent brightness of a red pixel with a pixel definition layer and a viewing angle dependent brightness of a red pixel without a pixel definition layer in an existing organic light-emitting display panel.
Figure 4:
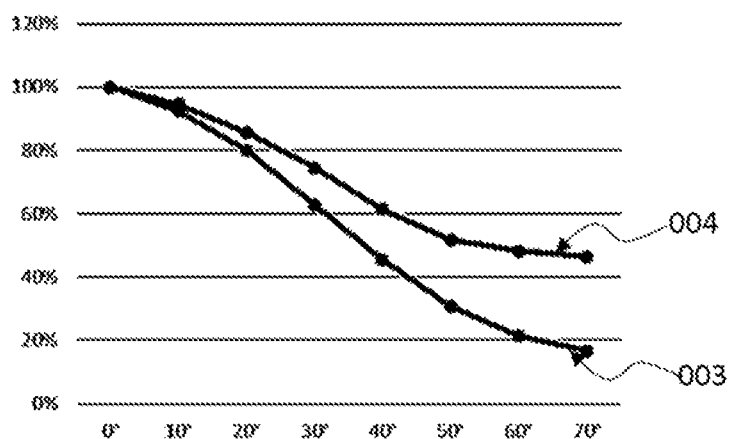
FIG. 4 illustrates a comparison between a viewing angle dependent brightness of a blue pixel with a pixel definition layer and a viewing angle dependent brightness of blue pixel without a pixel definition layer in an existing organic light-emitting display panel.

FIG. 3 illustrates a comparison between a viewing angle dependent brightness of a red pixel with a pixel definition layer and a viewing angle dependent brightness of red pixel without a pixel definition layer in an existing organic light-emitting display panel; and FIG. 4 illustrates a comparison between a viewing angle dependent brightness of a blue pixel with a pixel definition layer and a viewing angle dependent brightness of a blue pixel without a pixel definition layer in an existing organic light-emitting display panel.

As shown in FIG. 3 and FIG. 4, the ordinate denotes the brightness percentage (i.e., percentage of brightness at oblique viewing angle and perpendicular viewing angle), and the abscissa denotes the viewing angle (based on the perpendicular viewing angle). The curves numbered by 001 and 004 are the data measured when the pixel definition layer is disposed in the organic light-emitting panel. That is, the light-emitting material is subjected to a viewing angle-brightness test after the light-emitting material is filled in the pixel definition layer. The curves numbered by 002 and 003 are the data measured when the pixel definition layer is not disposed in the organic light-emitting display panel. That is, the light-emitting material selected for testing is not defined by the pixel definition layer, or the optical measurement area is far away from the edge of the light-emitting device (light-emitting material) in the display panel. Further, the light-emitting device including the pixel definition layer may be considered as a one-dimensional structure, and the influence of the edge of the light-emitting device may be omitted.

As illustrated by the curves numbered by 002 and 003 in FIG. 3 and FIG. 4, when the light-emitting material is not limited by the pixel definition layer, the brightness change trend of the red light with the viewing angle change is consistent with the brightness change trend of the blue light with the viewing angle change. However, when the light-emitting material is limited in the opening of the pixel definition layer for the testing, the attenuation degree of the red light is greater than the attenuation degree of the blue light as the viewing angle increases. As illustrated by the curves numbered by 001 and 004 in FIG. 3 and FIG. 4, when the viewing angle is increased to 70 degrees, the curve numbered by 001 (i.e., the red light) decays to approximately 30% in the abscissa and the curve numbered by 004 (i.e., blue light) decays to approximately 50% in the abscissa.

Thus, at the large viewing angle, the pixel definition layer may provide different effects on the brightness attenuations of lights with different wavelengths, resulting in different attenuation degrees of the brightness of the lights of two colors with the change of the viewing angle. That is, the attenuation degree of the brightness of light with a longer wavelength is greater than the attenuation degree of the light with a shorter wavelength. Thus, an image displayed by the display panel may ultimately exhibit a color shift at the large viewing angle.

Further, as shown in FIG. 2, when the height S of the pixel definition layer 14 increases, the brightness attenuation degree of the pixel decreases at the large viewing angle. Taking the red light with a longer wavelength and blue light with a shorter wavelength as examples.

Figure 5:
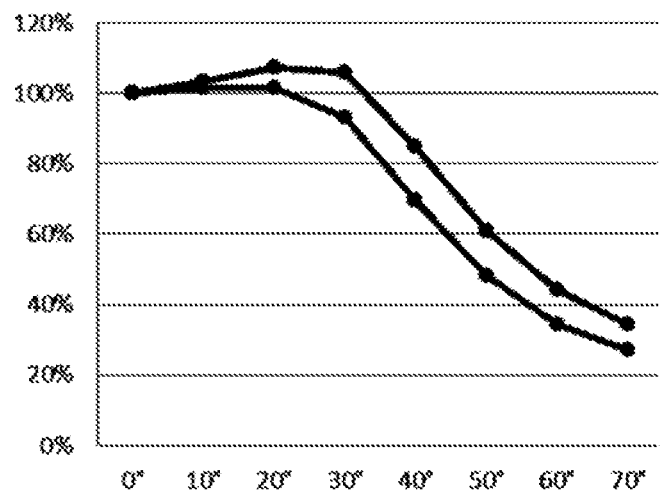
FIG. 5 illustrates a comparison between a viewing angle dependent brightness of red pixels having a pixel definition layer of different thicknesses in an existing organic light-emitting display panel.
Figure 6:
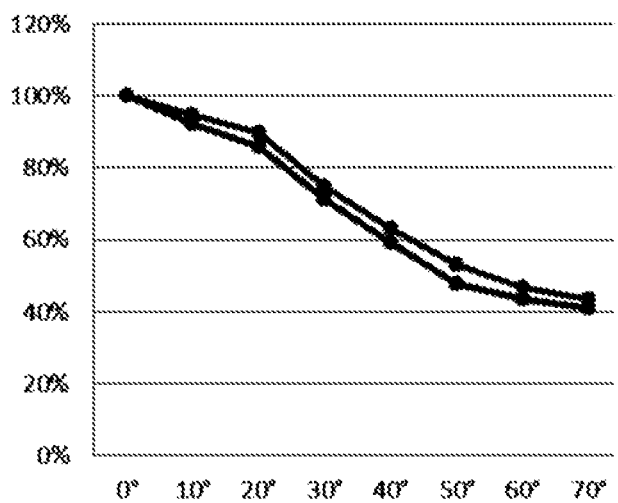
FIG. 6 illustrates a comparison between a viewing angle dependent brightness of blue pixels having a pixel definition layer of different thicknesses in an existing organic light-emitting display panel.

FIG. 5 illustrates a comparison between a viewing angle dependent brightness of red pixels with a pixel definition layer with different thicknesses in an existing organic light-emitting display panel; and FIG. 6 illustrates a comparison between a viewing angle dependent brightness of blue pixels with a pixel definition layer having different thicknesses in an existing organic light-emitting display panel.

FIG. 5 illustrates viewing angle dependent brightness of two red pixels. Each of the two red pixels may include a pixel definition layer. A thickness of the pixel definition layer of one red pixel may be approximately 1.0 µm; and a thickness of the pixel definition layer of another red pixel may be approximately 1.5 µm. FIG. 6 illustrates viewing angle dependent brightness of two blue pixels. Each of the two blue pixels may include a pixel definition layer. A thickness of the pixel definition layer of one blue pixel may be approximately 1.0 µm; and a thickness of the pixel definition layer of another blue pixel may be approximately 1.5 µm.

For ease of understanding, the values of the representative points of the brightness in FIG. 5 and FIG. 6 are illustrated in Table 1 and Table 2, respectively. Table 1 illustrates the values of the representative points of the brightness dependent viewing angle of the red pixels having the pixel definition layers with different thickness; and Table 2 illustrates the values of the representative points of the brightness dependent viewing angle of the blue pixels having the pixel definition layers having different thickness

TABLE 1

Values of the representative points of the brightness dependent viewing angle the red pixels.

| | PDL Thickness | |
|---|---|---|
| Viewing Angle | 1.0 um | 1.5 um |
| 0° | 100% | 100% |
| 10° | 101% | 103% |
| 20° | 102% | 107% |
| 30° | 93% | 106% |
| 40° | 69% | 85% |
| 50° | 48% | 61% |
| 60° | 34% | 44% |
| 70° | 27% | 34% |

TABLE 2

Values of the representative nodes of the viewing angle-brightness curve of the blue pixels

| | PDL Thickness | |
|---|---|---|
| Viewing Angle | 1.0 um | 1.5 um |
| 0° | 100% | 100% |
| 10° | 92% | 95% |
| 20° | 86% | 90% |
| 30° | 71% | 75% |
| 40° | 59% | 63% |

TABLE 2-continued

Values of the representative nodes of the viewing angle-brightness curve of the blue pixels

| Viewing Angle | PDL Thickness | |
| --- | --- | --- |
| | 1.0 um | 1.5 um |
| 50° | 48% | 53% |
| 60° | 44% | 47% |
| 70° | 41% | 44% |

The experimental data may suggest that, comparing the brightness dependent viewing angle of the red pixel having the 1.0-μm-thickness pixel definition layer, the brightness dependent viewing angle of the red pixel having the 1.5-μm—thickness pixel definition layer decreases slower as the viewing angle increases. That is, increasing the thickness of the pixel definition layer may effectively reduce the attenuation degree of the brightness of the red pixel at a large viewing angle. For example, at a viewing angle of 70 degrees, the brightness of the red pixel having the 1.0-μm—thickness pixel definition layer may be only 27% of the brightness of the red pixel having the 1.0-μm—thickness pixel definition layer at the perpendicular viewing angle, and the brightness of the red pixel having the 1.5-μm—thickness pixel definition layer may be only 34% of the brightness of the red pixel having the 1.5-μm—thickness pixel definition layer at the perpendicular viewing angle.

Figure 7:
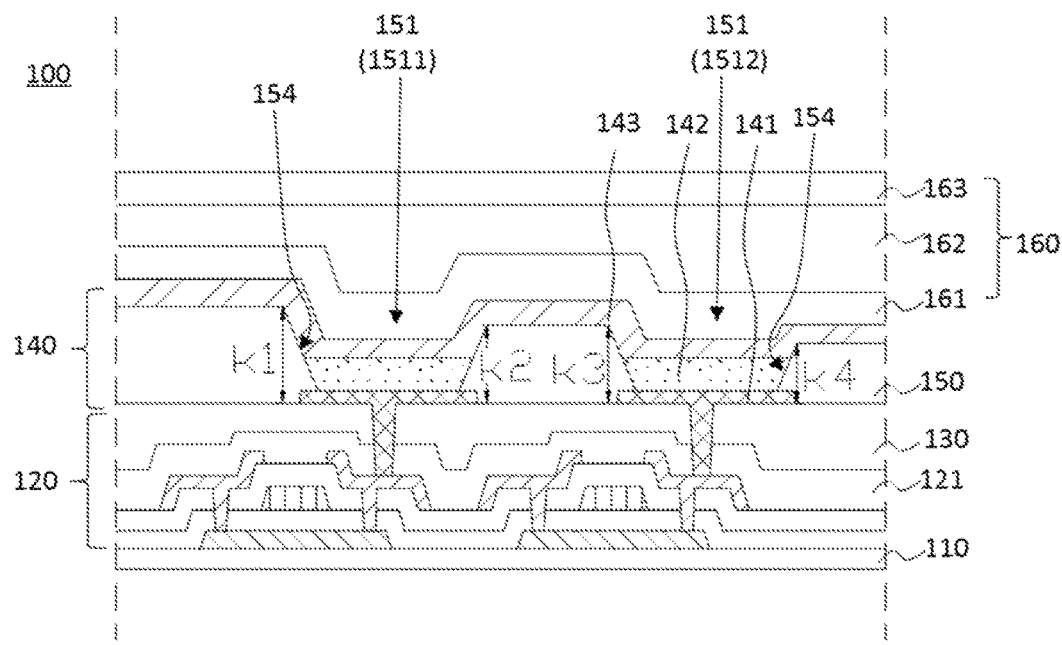
FIG. 7 illustrates an exemplary organic light-emitting display panel consistent with various disclosed embodiments.

In view of this, the present disclosure provides an organic light-emitting display panel and a display apparatus with suppressed color shift at the large viewing angle. FIG. 7 illustrates an exemplary organic light-emitting display panel 100 consistent with various disclosed embodiments.

As shown in FIG. 7, the organic light-emitting display panel 100 may include a substrate 110, array layer (or array substrate) 120 disposed on the substrate 110, and a display layer 140. The substrate 110 may be made of glass, polyimide (PI), polycarbonate (PC), polyether sulfone (PES), polyethylene terephthalate (PET), polyethylene naphthalate (PEN), polyarylate (PAR), glass fiber reinforced plastic (FRP), or other polymer materials. The substrate 110 may be transparent, translucent or opaque. In one embodiment, the substrate 110 may be a flexible substrate made of a polymer with a substantially small thickness, such as polyimide.

The substrate 110 may further include a buffer layer (not drawn in FIG. 7). The buffer layer may have a multiple-layer stacked structure including a plurality of inorganic layers and/or organic layers. The buffer layer may block oxygen and moisture, etc., to prevent moisture or impurities from diffusing through the substrate 110. Further, the buffer layer may also provide a flat surface on the upper surface of the substrate 110, and specific structure is not described in the present disclosure.

The array layer 120 may include a plurality of thin-film-transistors (TFTs), and a plurality of pixel circuits formed by the TFTs. The array layer 120 may control the light-emitting structures in the light-emitting material layer, i.e., OLEDs to emit light.

In one embodiment, the array layer 120 may include top-gate TFTs. The array layer 120 may include an active layer (not labeled) for forming the TFTs. The active layer 120 may include a source region and a drain region of the TFT. The source region and the drain region may be formed by doping N-type doping ions or P-type doping ions in the active layer. A channel region of the TFT may be formed between the source region and the drain region. The array layer 120 may also include a gate insulation layer formed on the active layer, and a gate of the TFT formed on the gate insulation layer. The array layer may also include an interlayer insulation layer. The interlayer insulation layer may be formed on the gate. In one embodiment, the interlayer insulation layer may be made of an insulation inorganic material, such as silicon oxide, or silicon nitride, etc.

In another embodiment, the interlayer insulation layer may be made of an insulating organic layer. A source electrode and a drain electrode of the TFT may be formed on the interlayer insulation layer. The source electrode and the drain electrode of the TFT may be electrically connected (or bonded) to the source region and the drain region of the TFT, respectively, through contact/through holes. The contact holes may be formed by selectively removing portions of the gate insulation layer and the interlayer insulation layer from the array layer 120.

Further, the array layer 120 may include a passivation layer 121. The passivation layer 121 may be formed on the TFTs. In particular, the passivation layer 121 may be formed on the source electrode and the drain electrode of the TFT. The passivation layer 121 may be made of an inorganic material, such as silicon oxide, or silicon nitride, etc., or made of an organic material.

Further, the array layer 120 may include a planarization layer 130. The planarization layer 130 may be disposed on the passivation layer 121. The planarization layer 130 may include an organic layer made of one of acrylic, polyimide (PI), and benzocyclobutene (BCB), etc. The planarization layer 130 may provide a planarizing function.

The array layer 120 may have a first surface facing the substrate 110 and an opposing second surface. The display layer 140 may be disposed the second surface of the array layer 120. In particular, the display layer 140 may be disposed on the planarization layer 130 of the array layer 120. The display layer 140 may include an anode layer 141, an organic light-emitting material layer 142, and a cathode layer 143. The anode layer 141, the organic light-emitting material layer 142, and the cathode layer 143 may be sequentially disposed along a direction away from the substrate 110.

The anode layer 141 may have a first surface facing the light-emitting material layer 142 and an opposing second surface. The display layer 140 may also include a pixel definition layer 150 disposed on the second surface of the anode layer 141. The pixel definition layer 150 may be made of an organic material, such as polyimide (PI), polyamide, benzocyclobutene (BCB), acrylic resin, or phenol resin, etc., or made of an inorganic material, such as SiNx, etc.

The anode layer 141 may include a plurality of anode patterns (not labeled) one-to-one corresponding to a plurality of pixels. The anode patterns of the anode layer 141 may be electrically connected to the source electrodes and/or the drain electrodes of the TFTs by through holes in the planarization layer 130.

Further, as shown in FIG. 7, the pixel definition layer 150 may include a plurality of openings 151 exposing the anode layer 141. The pixel definition layer 150 may cover the edges of the anode patterns of the anode layer 141. The organic light-emitting material layer 142 may be at least partially filled in the openings 151 and, meanwhile, may be in a direct contact with the anode layer 141. The organic light-emitting material 142 in an opening 151 may form a smallest light-emitting unit. Each light-emitting unit may emit light of different colors according to different organic light-emitting materials. The light-emitting unit may be electrically connected to a corresponding pixel circuit to form a pixel, and a plurality of pixels together may display images.

The organic light-emitting material layer 142 may be formed in the openings 151 of the pixel definition layer 150 by an inkjet printing process, a nozzle printing process, or an evaporation process, etc. The cathode layer 143 may be formed on the organic light-emitting material layer 142 by a vapor deposition process, etc. In one embodiment, the cathode layer 143 may completely cover the organic light-emitting material layer 142 and the pixel definition layer 150.

The plurality of openings 151 may include a plurality of first openings 1511 and a plurality of second openings 1512 (only one 1511 and one 1512 are shown in FIG. 7 for illustrative purposes). The organic light-emitting material 142 filled in the first opening 1511 may emit light of a first color, and the organic light-emitting material 142 filled in the second opening 1512 may emit light of a second color. A wavelength of the light of the first color may be greater than a wavelength of the light of the second color. Along a direction perpendicular to the organic light-emitting display panel 100, i.e., a thickness direction of the organic light-emitting display panel 100, the height of at least a portion of a sidewall 154 of the first opening 1511 is greater than the height of a sidewall 154 of the second opening 1512. That is, the thickness of at least a portion of the pixel definition layer 150 enclosing the first opening 1511 may be greater than the thickness of a portion of the pixel definition layer 150 enclosing the second opening 1512.

In one embodiment, the pixel definition layer 150 may include two opposing side surfaces: a first bottom surface adjacent to/facing the substrate 110 and a first top surface far away from the substrate 110. The opening 151 may completely penetrate the pixel definition layer 150, and the opening 151 may include a bottom opening at the first bottom surface and a top opening at the first top surface. The sidewall 154 may connect both the bottom opening and the top opening. Along the direction perpendicular to the organic light-emitting display panel 100, the height of the sidewall is equal to the distance between the top opening and the bottom opening of the opening.

In other words, the height of the sidewall is equal to the distance from the top opening to the first bottom surface of the opening. Although the pixel definition layer may also cover a portion of the anode layer, i.e., the first bottom surface may climb over the edge of the anode layer as the first bottom surface covers the edge of the anode layer, the first bottom surface may not be entirely disposed on one plane. Because the bottom openings may all be located on the anode layer, and the thickness of each anode layer pattern may be the same, when comparing the heights of sidewalls of different openings, the thicknesses of portions of the anode layer may compensate with each other. Therefore, the comparison of the heights of the sidewalls may be converted into a comparison of the distances from the top openings to the first bottom surfaces of the opening.

In one embodiment, at least one sidewall of the opening may have at least two different heights. The height of the sidewall of the opening may be an average height. Thus, the average height may be an average of the at least two different heights.

In one embodiment, the sidewall of the first opening may have a first height and a second height, and the sidewall of the second opening may have a third height and a fourth height. The height of the sidewall of the first opening may be an average of the first height and the second height, and the height of the sidewall of the second opening may be an average of the third height and the fourth height. The average height of the sidewall of the first opening may be greater than the average height of the sidewall of the second opening.

Further, as shown in FIG. 7, two sidewalls 154 of the first opening 1511 located at two different positions may have a first height k1 and a second height k2, respectively; and two sidewalls 154 of the second opening 1512 at two different positions may have a third height k3 and a fourth height k4, respectively, where $k1 \neq k2$; and $k3 \neq k4$. The height of the sidewall 154 of the first opening 1511 is K1, where $K1=(k1+k2)/2$. The height of the sidewall 154 of the second opening 1512 is K2; $K2=(k3+k4)/2$, where $K1>K2$.

In another embodiment, along a direction perpendicular to the organic light-emitting display panel, the average height of the sidewall of an opening may be an average of the heights at any limited number of different positions at the top opening of the opening, or the average of the heights of the sidewalls at different locations.

Figure 8:
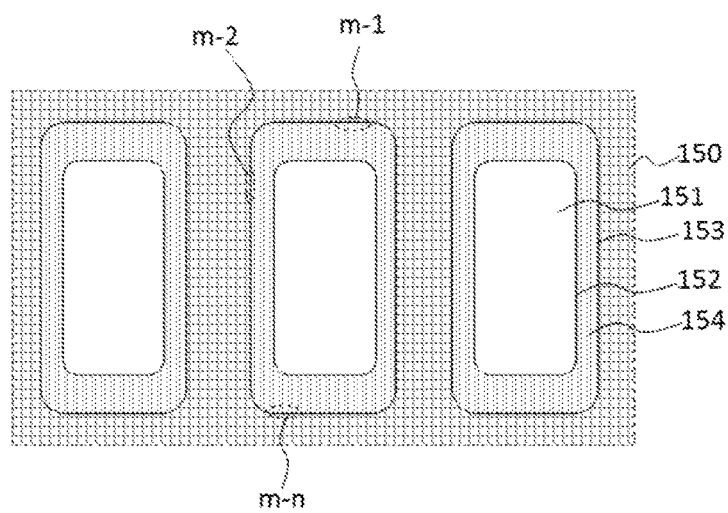
FIG. 8 illustrates a top view of an exemplary pixel definition layer of an exemplary organic light-emitting display panel in FIG. 7.

FIG. 8 illustrates a top view of an exemplary pixel definition layer of an exemplary organic light-emitting display panel in FIG. 7 consistent with various disclosed embodiments. As shown in FIG. 8, the pixel definition layer 150 may include at least one opening 151. The opening 151 may include a top opening 153 at the first top surface, a bottom opening 152 at the first bottom surface (not visible in FIG. 8 as is the bottom opening 152 is blocked by the first top surface), and a sidewall 154 connecting with the top opening 153 and the bottom opening 154. The top opening 153 may be greater than the bottom opening 152, and the projection of the top opening 153 on a plane where the display panel is located may surround the projection of the bottom opening 152 on the plane. As shown in FIG. 8, in one embodiment, the projection of the top opening 153 on the plane where the display panel is located may be a rectangle having rounded corners. Different positions of the top opening 153 may be referred to the different positions on the contour line of the rounded rectangle on which the marked top opening 153 is located.

With regard to "any limited number of different positions on the top opening" mentioned above, as shown in FIG. 8, it would be understood in a way that the sidewall 154 on different orientations of the opening 151 may have n different heights, where n is an integer. The sidewalls 154 with n different heights corresponds to the first position (m–1) to the n-th position (m–n) on the top opening 153, respectively. Along the direction perpendicular to the organic light-emitting display panel 100, from the first position (m–1) to the n-th position (m–n), the distances from the top opening 153 to the first bottom surface are represented with L1, L2, . . . and Ln. For illustrative purposes, only the first position (m–1), the second position (m–2) and the nth position (m–n) are illustrated in FIG. 8. The height of the sidewall 154 of the opening 151 is the average distance from the first position (m–1) and the n-th position (m–n) of the top opening 153 to the first bottom surface along the direction perpendicular to the organic light-emitting display panel 100. That is, the height of the sidewall 154 of the opening 151 is:

$$(L1+L2+ \ldots +Ln)/n.$$

The reason for averaging the sidewall heights are explained as follows. In certain embodiments, one opening may correspond to one light-emitting unit. According to the principle that a colorful image may only be displayed based on the pixel colors and brightness combinations, the light-emitting units (i.e., openings) has to be distributed according to a certain rule, and the organic light-emitting material filled in at least one opening and an adjacent opening may emit different colors of light. For example, a first opening may be disposed adjacent to a second opening. However, because the thickness of a portion of the pixel definition layer in which the portion of the pixel definition layer is enclosing the first opening is substantially large, the thickness of another portion of the pixel definition layer in which the another portion of the pixel definition layer is enclosing the second opening may be desired to be substantially small.

The first opening may have a first side facing the second opening and an opposing second side far away from the second opening; and the second opening may include a first side facing the first opening and an opposing second side far away from the first opening second. Thus, the thickness of the pixel definition layer between the first opening and the second opening may be desired to be in a range between the thickness of the pixel definition layer at second side of the first opening and the thickness of the pixel definition layer at the second side of the second opening.

That is, the pixel definition layer may include at least one first opening or second opening, and based on the different positions of the top opening, the distance between the top opening of the first opening/the second opening and the first bottom opening of the first opening/the second opening may have different values. The first opening may have a first sidewall facing the second opening and a second sidewall far away from the second opening. The height of the first sidewall of the first opening may be smaller than the height of the second sidewall of the first opening. Thus, the abrupt change in the thicknesses of the pixel definition layer may be suppressed.

The abrupt change in the thickness of the pixel definition layer may affect the subsequent formation of a film layer and the stability of the film layer structure. For example, a substantially steep inclining structure may be formed on the film layer disposed on the pixel definition layer. For a flexible display apparatus, an excessively concentrated stress may occur in the steep inclining structure when the display apparatus is being bent. Moreover, because the first opening and the second opening are substantially close, when the sidewall of the first opening facing the second opening is substantially high, the transmission of the light emitted from the second opening may be affected. Therefore, in certain embodiments, the sidewall of at least one first opening may be configured to include at least two different heights, and the average height of the side wall is the average of the at least two different heights.

In one embodiment, the height of the pixel definition layer is referred to the height along the direction perpendicular to the display panel. In another embodiment, the height of the pixel definition layer may be referred to the thickness of the pixel definition layer, and the thickness of the pixel definition layer is the thickness along a direction perpendicular to the display panel. In another embodiment, the height of the pixel definition layer may be referred to the distance between the top surface (or the first top surface, the surface away from the substrate) and the bottom surface (or the first bottom surface, the surface near the substrate) of the pixel definition layer and the distance between the top surface and the bottom surface is the distance along a direction perpendicular to the display panel.

It could be understood that, all the heights, thicknesses, and distances involved in embodiments of the present disclosure may be averaged according to certain requirements. The manner of averaging may be a combination of one or more of the methods provided in the present disclosure.

In one embodiment, the light of the first color is red light, and the light of the second color is blue light. The wavelength difference between the blue light and the red light may be substantially large. By compensating the difference between the red light and the blue light which have the largest spectral difference at a large viewing angle, the color shift of the display panel may be significantly reduced.

In one embodiment, the height of the sidewall 154 of the first opening 1511 may be greater than the height of the sidewall 154 of the second opening 1512 by more than 50 nm or the height of the sidewall 154 of the second opening 1512 may be greater than the height of the sidewall 154 of the first opening 1511 by 50 nm. That is, the difference between the heights of the sidewalls of the two openings corresponding to the two different color pixels may be configured to be equal to or greater than approximately 50 nm. Thus, the color shift of the display panel at a large viewing angle may be reduced and, meanwhile, the difficulty of the fabrication process may be reduced. When the difference between the heights of the sidewalls of the two openings is substantially small (e.g., smaller than 50 nm), it may be difficult to control the patterning degree during the production, and the first opening and the second opening may be substantially similar due to process errors. Accordingly, the anti-color shift effect may not be achieved because the difference between the heights of sidewalls of two different openings may be insufficient.

The disclosed organic light-emitting display panel may be able to effectively reduce the color shift of the displayed images at large viewing angles. By filling a light-emitting material emitting a long wavelength of light in an opening of a pixel definition layer with a high sidewall, and filling a light-emitting material emitting a short wavelength of in an opening of a pixel definition layer with a low sidewall, the difference between the heights of the sidewalls of the openings of the pixel definition layer, the different influences of the pixel definition layer on the brightness attenuation of lights with different wavelengths at the large viewing angle may be compensated, while the normal operation of each structure and device may not be affected.

Further, when propagating inside the pixel definition layer, the light may be scattered, refracted and reflected at the interface between the pixel definition layer and a layer below the pixel definition layer (such as anode, metal layer, etc.), and the light may be dispersed to all directions. Therefore, more light may be emitted toward oblique viewing angles or large viewing angles, and the brightness of the pixels at a large viewing angle may be increased, accordingly. Thus, the ratio between the brightness of the pixel at the large viewing angle and the brightness of the pixel at the perpendicular viewing angle may be increased. That is, the difference between the brightness of the pixel at the perpendicular viewing angle and the brightness of the pixel at the large viewing angle may be decreased.

In the disclosed embodiments, through filling a light-emitting material emitting light of a long wavelength in an opening of a pixel definition layer with a high sidewall, and filling a light-emitting material emitting light of a short wavelength in an opening of a pixel definition layer with a low sidewall, the light of the long wavelength may have more chance to enter the pixel definition layer, thereby being fully scattered, refracted and reflected. The proportion of the light with the long wavelength at large viewing angles may be increased, the color shift caused by a large brightness attenuation of the light of the long wavelength at the large viewing angle may be avoided, and the color shift of the display panel at the large viewing angle may be further reduced.

Similarly, for the light of the short wavelength, to reduce the difference in brightness at a large viewing angle with the light with long wavelength and further reduce the color shift of the display panel at the large viewing angle, the layer structure of the pixel where the light of the short wavelength is located may be configured in a way opposite to the layer structure of the pixel where the light of the longe wavelength is located.

FIG. 7 only shows one first opening, one second opening and two thin film transistor structures for illustrative purposes, and the number of the first openings and the second openings and thin film transistors is not limited by the present disclosure. For example, in certain embodiments, the number of the first openings and the second openings may be set to any appropriate number according to the resolution requirement of the display panel.

Figure 9:
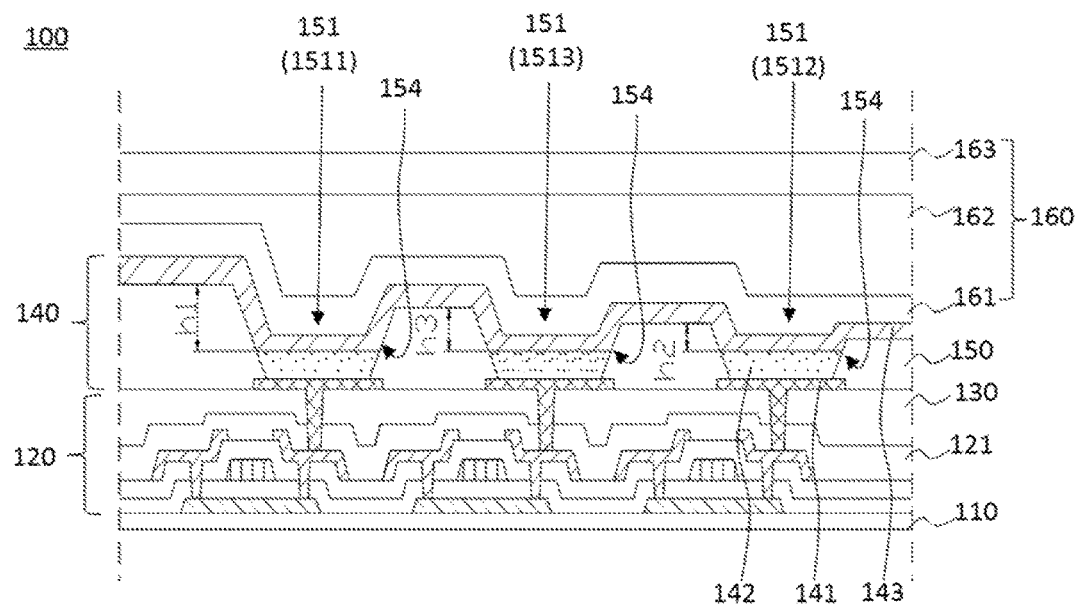
FIG. 9 illustrates another exemplary organic light-emitting display panel consistent with various disclosed embodiments.
Figure 10:
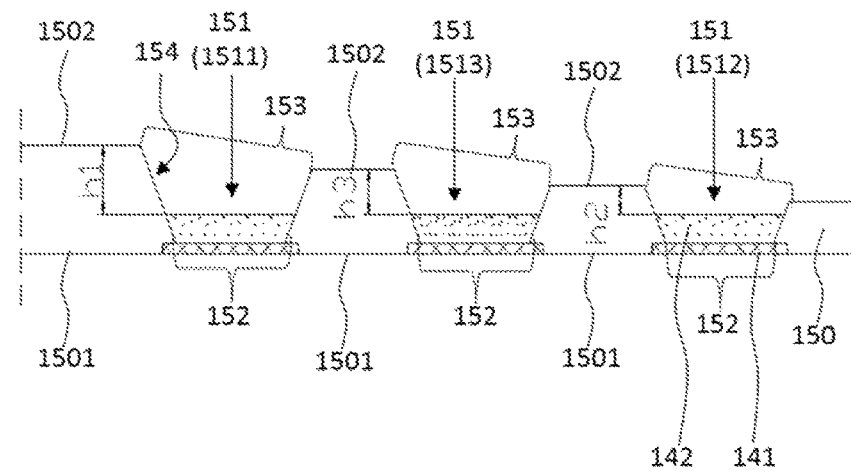
FIG. 10 illustrates an enlarged view of openings of an exemplary pixel definition layer of another exemplary organic light-emitting display panel in FIG. 9.

FIG. 9 illustrates another exemplary organic light-emitting display panel consistent with various disclosed embodiments; and FIG. 10 illustrates an enlarged view of openings of an exemplary pixel definition layer of another exemplary organic light-emitting display panel in FIG. 9. The details similar to above described embodiments are not be described herein.

As illustrated in FIG. 9 and FIG. 10, in one embodiment, the plurality openings 151 may also include a plurality of third openings 1513. The organic light-emitting material layer 142 filled in a third opening 1513 may emit light of a third color; and a wavelength of the light of the third color may be greater than the wavelength of the light of the second color; and the wavelength of the light of the third color may be smaller than the wavelength of the light of the first color. In one embodiment, the light of the third color is green light.

Further, the average height of the sidewall of the third opening may be greater than the average height of the sidewall of the second opening and the average height of the sidewall of the third opening may be smaller than the average height of the sidewall of the first opening. Through including the third opening and setting the average height the sidewall of the third opening with a value between the average height of the sidewall of the first opening and the average height of the sidewall of the second opening, the third opening may play a transitional role to avoid the effect on other display affects/the disposition of other films due to the large structural difference between the first opening and the second opening. Accordingly, the color drift of the display panel at the large viewing angle may be reduced. All the pixels of the display panel may be compensated for the difference in the brightness at large viewing angles through the pixel definition layer.

In one embodiment, as shown in FIG. 10, the pixel definition layer 150 may include two side surfaces disposed opposite to each other. The two side surfaces are the first bottom surface 1501 adjacent to the substrate 110 and an opposing first top surface 1502 away from the substrate 110. The pixel definition layer 150 may also include an opening 151 penetrating the pixel definition layer 150. The opening 151 may include a bottom opening 152 at the first bottom surface 1501, a top opening 153 at the first top surface 1502, and a sidewall 154 connecting with both the bottom opening 152 and the top opening 153.

In one embodiment, as shown in FIG. 9 and FIG. 10, along a direction perpendicular to the organic light-emitting display panel, a distance from the top opening 153 of at least a portion of the first opening 1511 to a top surface of the organic light-emitting material layer 142 in the opening 151 is h1. The distance from the top opening 153 of the second opening 1512 to the top surface of the organic light-emitting material layer 142 in the opening 151 is h2, where h1≥h2. In another embodiment, h1>h2.

In embodiment, the drop between the top opening 153 of the third opening 1513 and the organic light-emitting material layer 142 filled in the opening 151 is h3, where h1>h3>h2.

The average drop mentioned here would be understood in the same way as the average height.

For example, in one embodiment, as shown in FIG. 9 and FIG. 10, along a direction perpendicular to the organic light-emitting display panel, the average drop between the top opening 153 of the first opening 1511 and the organic light-emitting material layer 142 filled in the first opening 1511 is H1. The average drop between the top opening 153 of the second opening 1512 and the organic light-emitting material layer 142 filled in the first opening 1511 is H2, where H1≥H2 . The average drop between the top opening and the organic light-emitting material may be referred as an average value of the difference between the respective positions of the top opening and the top surface of the organic light-emitting material layer. In another embodiment, H1>H2.

In one embodiment, the average drop between the top opening 151 of the third opening 1513 and the organic light-emitting material layer 142 filled in the third opening 1513 is H3, wherein H1>H3>H2. The average drop mentioned here would be understood in the same way as the average height.

By designing different drops between the top opening corresponding to pixels of different colors and the top surface of the organic light-emitting material layer filled in the corresponding top openings, light of an obvious brightness attenuation at a large viewing angle may have a longer distance to pass through the opening after being emitted from the upper surface of the light-emitting material layer. Therefore, the light may have more chance to enter the pixel definition layer, and be fully scattered, refracted and reflected. The proportion of the light of the obvious brightness attenuation at the large viewing angle may be increased; and the color drift of the display panel at the large viewing angle may be further reduced Further, as shown in FIG. 9 and FIG. 10, in one embodiment, the organic light-emitting display panel may also include a thin film encapsulation layer 160. The display layer 140 may have first side facing the array layer 120 and an opposing second side far away from the array layer 120. The thin film encapsulation layer 160 may be disposed on the second side of the display layer 140. The thin film encapsulation layer 160 may cover the entire display layer 140 for sealing the display layer 140. In one embodiment, the thin film encapsulation layer 160 may be disposed on the cathode layer 143. The thin film encapsulation layer 160 may include a first inorganic encapsulation layer 161, a first organic encapsulation layer 162, and a second inorganic encapsulation layer 163 sequentially disposed along a direction away from the substrate 110. The thin film encapsulation layer 160 may fill the gap between the first top surface 1502 and the organic light-emitting material layer 142.

The first organic encapsulation layer 162 may have a first surface facing the array layer 120; and an opposing second surface away from the array layer 120. In one embodiment, the second surface of the first organic encapsulation layer 162 may be a flat surface. Thus, the distance from the first openings of different pixels to the top surface of the the thin film encapsulation layer, i.e., the second surface of the thin film encapsulation layer 162, may be different. Furthermore, the depth of the thin film encapsulation layer 160 filled in the openings of the pixel definition layer of different pixels may also be different. The depth of the thin film encapsulation layer 160 filled in the openings of the pixel definition layer may be referred to as the average heights as described above.

The light-emitting effect of an organic light-emitting device may be affected not only by the pixel definition layer but also by the thin film encapsulation layer. For the flexible organic light-emitting display panel, to ensure its bendable or rollable characteristics, a glass encapsulation may not be used; and a thin film encapsulation may be desired. The thin film encapsulation layer may be disposed on the display layer, and the first surface of the thin film encapsulation layer facing the display layer will fluctuate with the pixel definition layer and the openings of the pixel definition layer. Because the encapsulation structure in the prior art fluctuates at the openings of the pixel definition layer and the openings of the pixel defining layer are essential structures of the display panel, the fluctuation of the thin film encapsulation layer may be unavoidable.

Further, for a regular display panel, a normal display may only be achieved when the light emitted by the light-emitting device passes through the thin film encapsulation layer. When the light passes through the thin film encapsulation layer, the light emitted from the pixels may pass through more complicated interfaces due to the different optical characteristics of the light of different wavelengths and the fluctuation of the thin film encapsulation layer. Therefore, the brightness difference between the pixels of two colors at a large viewing angle may be further amplified after passing through the thin film encapsulation layer, and the color drift of the display panel may be further increased at the large viewing angles.

In one embodiment, by designing different drops between the top openings of the pixel definition layer corresponding to pixel of different colors and the top surface of the organic light-emitting material layer, the depth of the thin film encapsulation layer filled in the openings of the pixel definition layer of different pixels may be different, the thin film encapsulation layer fluctuates differently at the different openings of the pixel definition layer of different pixels. Therefore, the light of a large brightness attenuation at a large viewing angle may have more chance to be scattered, refracted and reflected at the interface between the pixel definition layer and the thin film encapsulation layer. Accordingly, the proportion of the light of the large brightness attenuation at the large viewing angle may be increased, and the color drift of the display panel (especially for flexible display panel) at the large viewing angle may be further reduced. The structures with defects otherwise reducing the display effect may be turned into advantageous structures that may improve the display effect.

Figure 11:
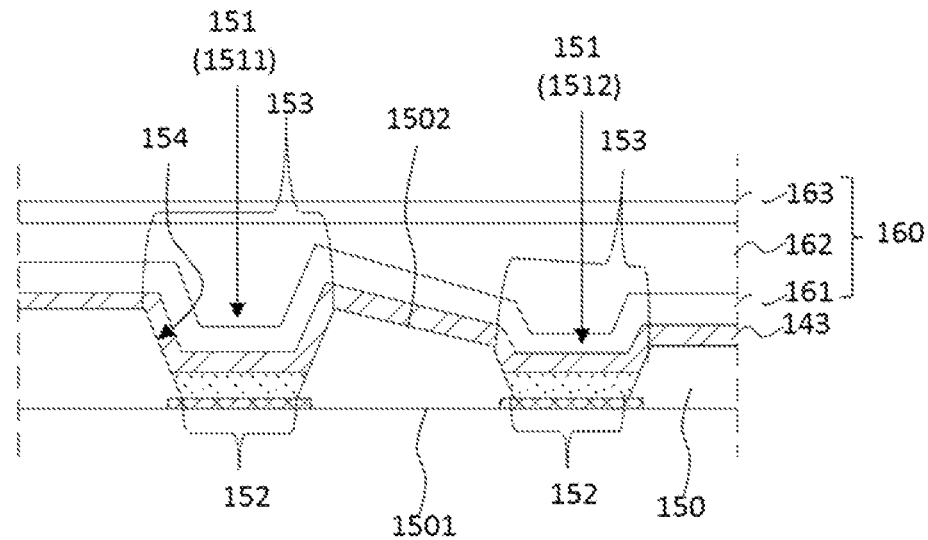
FIG. 11 illustrates an exemplary pixel definition layer of another exemplary organic light-emitting display panel consistent with various disclosed embodiments.

FIG. 11 illustrates an exemplary pixel definition layer of another exemplary organic light-emitting display panel consistent with various disclosed embodiments. As shown in FIG. 11, the pixel definition layer 150 may have a first side facing the substrate 110 and a second side far away from the substrate 100. Further, the pixel definition layer 150 may include a first bottom surface 1501 at the first side of the pixel definition layer 150 and a first top surface 1502 at the second side of the pixel definition layer 150. Further, the pixel definition layer 150 may also include a plurality of openings 151 penetrating the pixel definition layer 150. A opening 151 may include a bottom opening 152 on the first bottom surface 1501, a top opening 153 on the first top surface 1502, and a sidewall 154 connecting both the bottom opening 152 and the top opening 153.

In one embodiment, the first top surface 1502 may be continuous beyond the top opening 153. Thus, an abrupt change in the thickness of the pixel definition layer may be avoided. The abrupt change may be un-desired for the subsequent formation of a film layer/the stability of the film layer structure. In particular, a very steep inclining structure may be formed on the film layer on the pixel definition layer. Especially for a flexible display panel, an excessively concentrated stress may occur on the steep slope.

Further, because the film encapsulation layer may be disposed above the pixel definition layer, it may fluctuate as the top surface of the pixel definition layer fluctuates, and the light-emitting effect of the organic light-emitting device may be affected not only by the pixel definition layer but also by the fluctuation of the thin film encapsulation layer. Due to the different optical characteristics of the light of wavelengths and the fluctuation of the thin film encapsulation layer, the light emitted from the pixels may pass through a more complicated interface. Therefore, the difference in brightness between the pixels of the two colors at large viewing angles may be further amplified after passing through the thin film encapsulation layer; and the color drift of the display panel at large viewing angles may be further increased. Therefore, improving the flatness of the thin film encapsulation layer may ensure the continuity of the pixel definition layer (or the first top surface); and the color drift of the display panel may be reduced.

In one embodiment, the first top surface 1502 may not be parallel with the first bottom surface 1501, along at least one direction from the second opening 1512 to the first opening 1511, the first top surface 1502 may incline away from the first bottom surface 1501. Accordingly, the thickness of the pixel defining layer may change gradually along the direction from the second opening to the first opening. Thus, the abrupt change of the thickness of the pixel definition layer as well as the steps may be prevented. Especially for a flexible display, an excessively concentrated stress on the steps of a layer disposed on the pixel definition may be avoided when the display panel is being bent.

In one embodiment, along a direction perpendicular to the organic light-emitting display panel 100, an inclining distance of the first top surface 1502 inclining in a direction far away from the first bottom surface 1501 may be less than a thickness of the thin film encapsulation layer 160. That is, along the direction perpendicular to the organic light-emitting display panel 100, the drop between the top opening 1502 of the first opening 1511 and the top opening 1502 of an adjacent second opening 1512 may be smaller than the thickness of the thin film encapsulation layer 160. In one embodiment, the inclining distance of the first top surface 1502 inclining in a direction far away from the first bottom surface 1501 may be less than a thickness of the first inorganic encapsulation layer 161. Thus, a fluctuating top surface caused by filling the openings with the pixel definition layer may be prevented from forming on the second side of the thin film encapsulation layer (i.e., the side of the thin film encapsulation layer away from the substrate). Further, the light emitted from the pixels may be prevented from passing through a more complicated interface caused by the different optical characteristics of the light of different wavelengths and the fluctuation of the thin film encapsulation layer. Further, a further amplification of the difference in brightness between the pixels of the two colors at large viewing angles after passing through the thin film encapsulation layer may be prevented.

Figure 12:
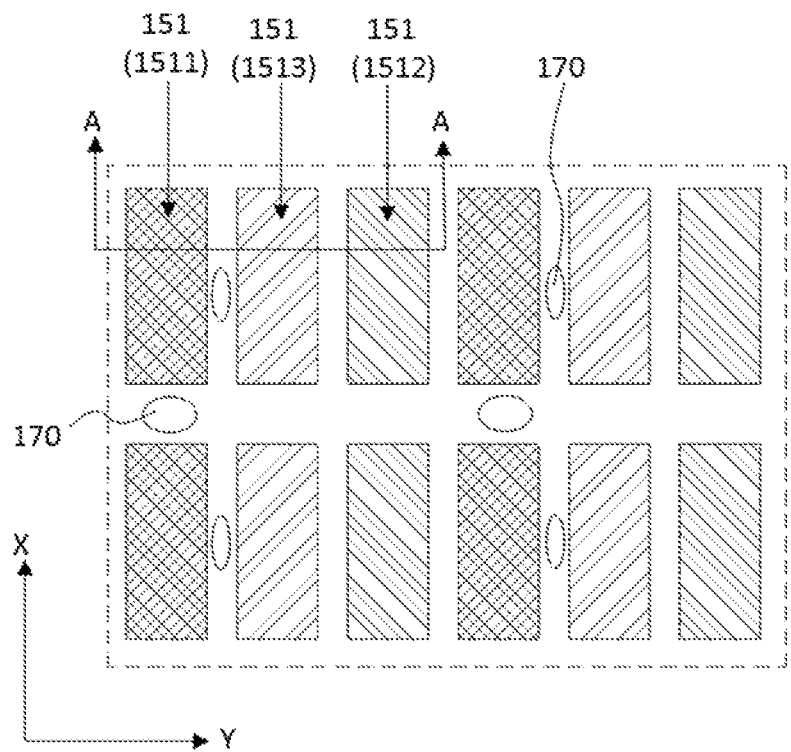
FIG. 12 illustrates a top view of another exemplary organic light-emitting display panel consistent with disclosed embodiments.
Figure 13:
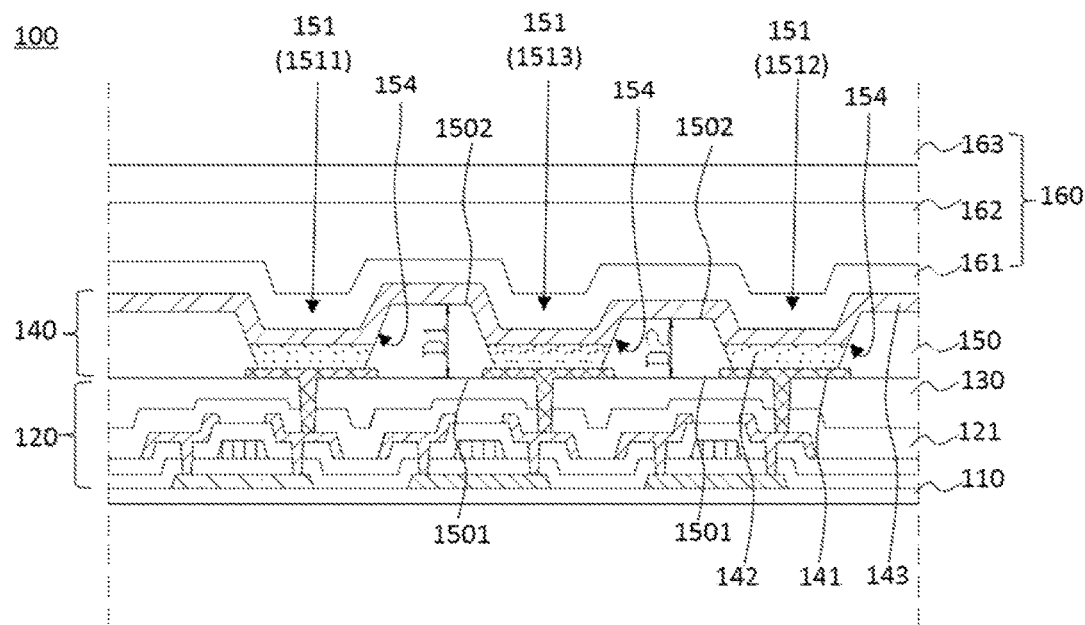
FIG. 13 illustrates an A-A-sectional view of another exemplary organic light-emitting display panel in FIG. 12.

FIG. 12 illustrates a top view of another exemplary organic light-emitting display panel consistent with disclosed embodiments. FIG. 13 illustrates an A-A-sectional view of another exemplary light-emitting display panel in FIG. 12. The details similar to the previous described embodiments may be omitted herein.

As shown in FIG. 12 and FIG. 13, the openings 151 may include a plurality of first openings 1511 and second openings 1512, and a plurality of third openings 1513. In a plane parallel to the display panel 100 and along a first direction X and a second direction Y, the openings 151 may be disposed as a matrix. The first direction X may cross the second direction Y. In one embodiment, the first direction X is perpendicular to the second direction Y.

In one embodiment, an orthogonal projection of the opening 151 onto the plane where the display panel 100 is located is a rectangle/a rounded rectangle, and the sides of the rectangle/the rounded rectangle may be parallel to the first direction X/the second direction Y, respectively. In one embodiment, the orthogonal projection of each opening 151 onto the plane where the display panel 100 is located has the same shape and size.

Further, along the first direction X, the first openings 1511 may be disposed adjacent to each other; the second openings 1512 may be disposed adjacent to each other; and the third openings 1513 may be disposed adjacent to each other. Along the second direction Y, the first openings 1511, the second openings 1512 and the third openings 1513 may be alternately distributed.

In one embodiment, the organic light-emitting display panel 100 may also include a plurality of spacers 170 disposed between the pixel definition layer and the cathode layer. The orthogonal projection of a spacer 170 onto the pixel definition layer may be adjacent to the first opening 1511. By including the support pillars 170, the anti-crashing capability of the display panel 100 may be improved. Further, because the spacers 170 may be adjacent to the first openings, which may be equivalent to increase the height of the sidewalls of the first openings, the color drift of the organic light-emitting display panel at large viewing angles may be reduced.

In one embodiment, the orthogonal projection of the spacer 170 onto the pixel defining layer 150 may be located between two adjacent first openings 1511.

In another embodiment, the orthogonal projection of the spacer 170 on the pixel defining layer 150 may be located between the first opening 1511 and an adjacent third opening 1513.

For the pixel distribution provided in the disclosed embodiment, the support pillar may be disposed between two adjacent first openings/between a first opening and an adjacent third opening. The spacer may be unnecessary to be adjacent to the second opening. When the anti-crashing ability of the organic light-emitting display panel is increased, the height of the sidewall of the first opening may be increased without affecting the second opening. The color drift of the organic light-emitting display panel at large viewing angles may be further reduced.

In one embodiment, in at least one first cross section of the organic light-emitting display panel 100, the first top surface 1502 may be parallel to the first bottom surface 1501. The first cross section may be perpendicular to the plane where the organic light-emitting display panel 100 is located; and may be parallel to the second direction Y. Only in the disclosed embodiments, the cross section in the A-A direction illustrated in FIG. 12 and FIG. 13 represents the first cross section; and represents only one alternative embodiment of the first cross section.

Further, in the first cross section and between the first opening 1511 and the third opening 1513, the distance between the first top surface 1502 and the first bottom surface 1501 is D1; and between the second opening 1512 and the third opening 1513 and the distance between the first top surface 1502 and the first bottom surface 1501 is D2, where D1>D2. In one embodiment, between the first opening 1511 and the second opening 1512, the distance between the first top surface 1502 to the first bottom surface 1501 may be between D1 and D2.

In one embodiment, the design that the first top surface is parallel to the first bottom surface may be substantially sample; and may be beneficial to the subsequent formation of a film layer. At the same time, it may be beneficial to reduce the complexity of the film layer interface and the amplification of the brightness difference of the light of different wavelengths at large viewing angles.

Through the pixel distribution approach provided in the disclosed embodiment, the third opening may be disposed between the first opening and the second opening, and the height of the pixel defining layer between the first opening and the third opening may be greater than the height of the pixel defining layer between the second opening and the third opening. By implementing the thickness change of the pixel defining layer at the third opening, while meeting the requirements of the third opening for the thickness of the pixel definition layer and keeping the average height of the sidewall of the third opening of the pixel definition layer between the height of the sidewall of the third opening adjacent to the first opening and the height of the sidewall of the third opening adjacent to the second opening, the first top surface may be ensured to be parallel to the first bottom surface. That is, although the thicknesses of the pixel definition layer around different openings may be different, through the transition of the third opening the first top surface may still be ensured to be parallel to the first bottom surface.

Figure 14:
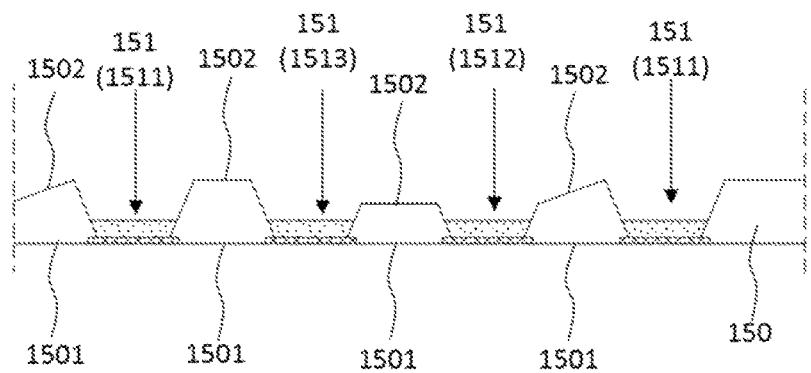
FIG. 14 illustrates another A-A sectional view of another exemplary pixel definition layer in FIG. 12.

FIG. 12 illustrates a top view of another exemplary organic light-emitting display panel consistent with disclosed embodiments. FIG. 14 illustrates another A-A sectional view of an exemplary pixel definition layer of another exemplary organic light-emitting display panel in FIG. 12. The details similar with the previous described embodiments would not described again.

The difference between the disclosed embodiments and the previous embodiments may include that the organic light-emitting display panel may include at least one second cross section. The second cross section may be perpendicular to the organic light-emitting display panel; and may be parallel to a second direction. Only in this embodiment, the cross section in the A-A direction illustrated in FIG. 12 and FIG. 14 represents the second cross section and represents only one exemplary example of the second cross section.

In the at least one second cross section, at least a portion of the first top surface 1502 may be parallel to the first bottom surface 1501; and along at least one direction from the second opening 1512 to the first opening 1511, the first top surface 1502 may incline far away from the first bottom surface 1501. Thus, the thickness of the pixel definition layer may change gradually along the direction from the second opening to the first opening. Accordingly, an abrupt thickness change of the pixel definition layer may be prevented; and steps may not be formed. Further, the gradually changed thickness of the pixel definition layer may be beneficial to the subsequent formation of a film; and a peeling off of the film may be avoided; and the stability of the film structure may be improved. For a flexible display panel, an excessively concentrated stress may occur on the steps that are disposed on upper layer of the pixel definition layer if the steps are formed.

Further, between the first opening 1511 and the third opening 1513, the distance between the first top surface 1502 and the first bottom surface 1501 is D1; and between the second opening 1512 and the third opening 1513, the distance between the first top surface 1502 and the first bottom surface 1501 is D2, where D1>D2.

Figure 15:
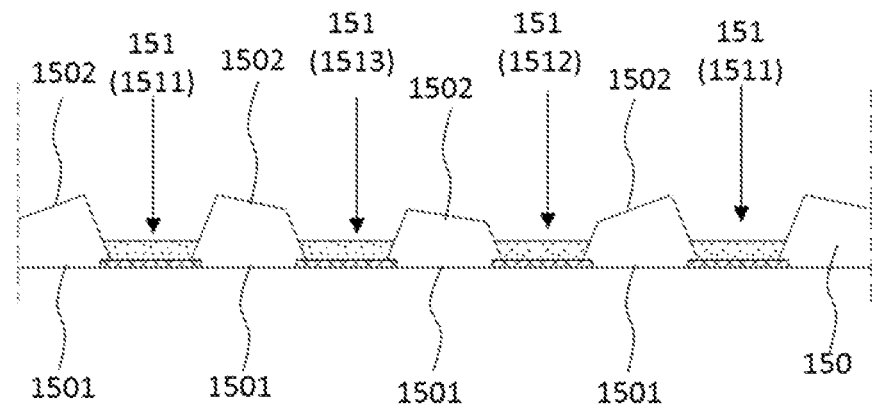
FIG. 15 illustrates another A-A sectional view of another exemplary pixel definition layer in FIG. 12.

FIG. 15 illustrates another A-A sectional view of an exemplary pixel definition layer of another exemplary organic light-emitting display panel in FIG. 12. The details of the disclosed embodiments similar with the previous embodiments will not be described herein.

The difference between the disclosed embodiments and the previous embodiments may include that the first top surface 1502 may not be parallel to the first bottom surface 1501. Further, between the first opening 1511 and the third opening 1513 and along a direction from the second opening 1512 to the first opening 1511, the first top surface 1502 may incline in a direction far away from the first bottom surface 1501. Between the second opening 1512 and the third opening 1513 and along a direction from the second opening 1512 to the third opening 1513, the first top surface 1502 may incline in a direction far away from the first bottom surface 1501. Between the first opening 1511 and the third opening 1513, along a direction from the third opening 1513 to the first opening 1511, the first top surface 1502 may incline in a direction far away from the first bottom surface 1501.

Figure 16:
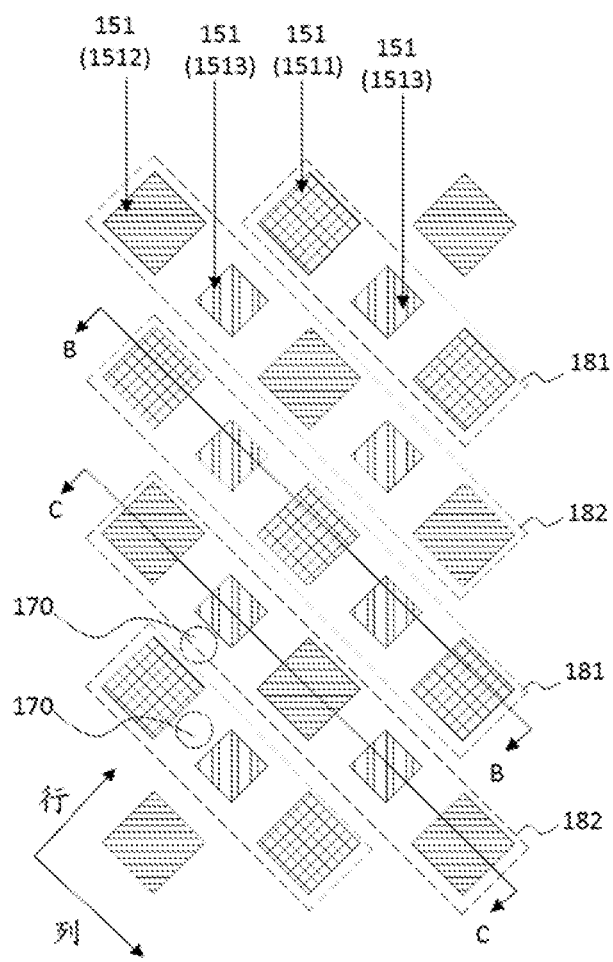
FIG. 16 illustrates a top view of another exemplary organic light-emitting display panel consistent with disclosed embodiments.

FIG. 16 illustrates a top view of another exemplary organic light-emitting display panel consistent with various disclosed embodiments. The details similar with the previous embodiments are not described herein.

As shown in FIG. 16, the openings 151 may include a plurality of first openings 1511 and second openings 1512, and a plurality of third openings 1513. The organic light-emitting material layer 142 filled in a first opening 1511 may emit light of a first color; the organic light-emitting material 142 filled in a second opening 1512 may emit light of a second color; and the organic light-emitting material layer 142 filled in a third opening 1513 may emit light of a third color. A wavelength of the light of the first color may be greater than a wavelength of the light of the second color; and a wavelength of the light of the third color is greater than the wavelength of the light of the second color and smaller than the wavelength of the light of the first color. In one embodiment, the light of the first color is red light; the light of the second color is blue light; and the light of the third color is green light.

The opening 151 may be distributed as a matrix along a row direction and a column direction. The column direction may be perpendicular to the row direction. The openings 151 may be divided into a plurality of first column units 181 and a plurality of second column units 182. A first column unit 181 may include the first openings 1511 and the second openings 1513. Along the column direction, the first openings 1511 and the second openings 1513 may be alternately distributed. A second column unit 182 may include the second openings 1512 and the third openings 1513. Along the column direction, the second openings 1512 and the third openings 1513 may be alternately distributed. The first column units 181 and the second column units 182 may be alternately distributed along the row direction. Along the row direction, the first openings 1511 and the third openings 1513 may be alternately distributed; and the second openings 1512 and the third openings 1513 may be alternately distributed.

Further, the present disclosed organic light-emitting display panel may include two types of cross sections, named as a third cross section and a fourth cross section. The third cross section and the fourth cross section may be both perpendicular to the organic light-emitting display panel; and may be both parallel to the column direction.

Figure 17:
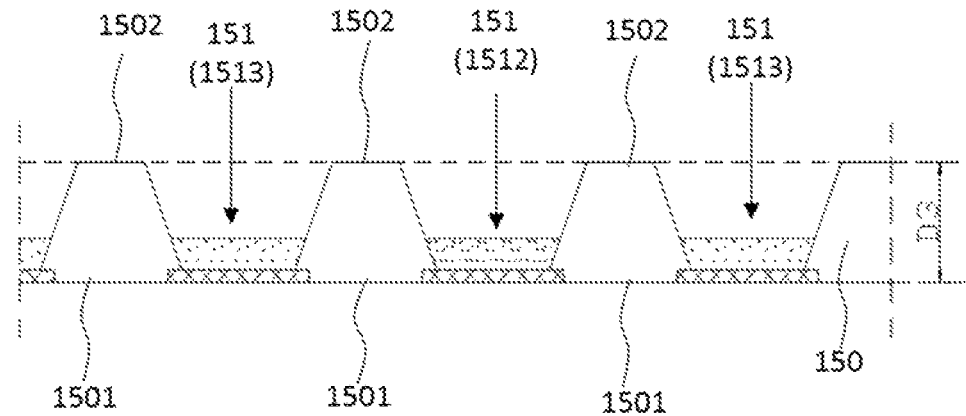
FIG. 17 illustrates a B-B sectional view of another exemplary organic light-emitting display panel in FIG. 16.

FIG. 17 illustrates an exemplary B-B-sectional view of another exemplary organic light-emitting display panel in FIG. 16. The B-B-sectional view is an exemplary third section in the disclosed embodiments.

As illustrated in FIG. 16 and FIG. 17, the third-cross section may penetrate the first column units 181. In the third cross section, the first top surface may be parallel to the first bottom surface, and the distance between the first top surface and the first bottom surface is D3.

Figure 18:
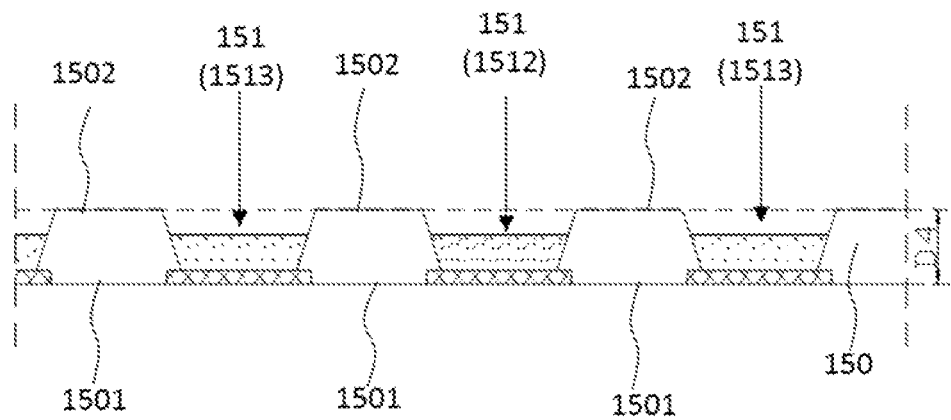
FIG. 18 illustrates a C-C sectional view of another exemplary organic light-emitting display panel in FIG. 16.

FIG. 18 illustrates an exemplary C-C-sectional view of another exemplary organic light-emitting display panel in FIG. 16. The C-C-sectional view is an exemplary fourth section in the disclosed embodiments.

As illustrated in FIG. 16 and FIG. 18, the fourth cross section may penetrate the first column units 182. In the fourth cross section, the first top surface is parallel to the first bottom surface; and the distance between the first top surface and the first bottom surface is D4, where D3>D4.

In one embodiment, the heights of the pixel definition layer in the stripe region extending along the row direction corresponding to the first column units 181 are all D3; and the heights of the pixel definition layer in the stripe region along the row direction corresponding to the second column units 182 are both D4. That is, the pixel definition layer may maintain a uniform height along a fixed row direction/a fixed column direction. That the pixel definition layer may maintain a uniform height in a fixed row direction/a fixed column direction may be more beneficial to the parallel distribution of the first top surface and the first bottom surface.

By combining the pixel distribution approach provided in the disclosed embodiments, whether in the row direction/the column direction, the first openings are not adjacent to the second openings; and the first openings and the second openings may all be alternately distributed along the row direction or the column direction. Thus, for any one of the first openings, the heights of the sidewalls in each direction of the first opening, or the heights of the pixel defining layer enclosing the first opening, may be all the same, and may all be greater than the heights of the pixel defining layer enclosing the second opening. The second opening may also be able to achieve the same height of the sidewalls in each direction. Moreover, the wavelength of the light emitted by the light emitting-material layer filled in the third opening is between the height of the sidewall of the third opening adjacent to the first opening and the height of the sidewall of the third opening adjacent to the second opening. Thus, through the present pixel disposition approach, a portion of a third opening may be adjacent to the first opening; and a portion of the third opening may be adjacent to the second opening. Accordingly, the average height of the sidewalls of the third opening may be between the average height of the sidewalls of the first opening and the average height of the second opening.

Further, in the disclosed embodiments, the height of the pixel definition layer corresponding to the first opening may be ensured to be greater than the height of the pixel definition layer corresponding to the second opening; and the influence of the pixels of the first opening on the pixels of the second opening may be avoided, and the interference between the first opening and the second opening may be prevented. Further, the correction degree of the color drift for the sidewalls on each direction in the openings may also be the same. Thus, the uniformity in preventing the color drift at large viewing angles may be improved; and the color drift in all directions may be reduced.

In one embodiment, the area of the orthogonal projection of the third opening 1513 onto the substrate 110 may be smaller than the area of the orthogonal projection of the first opening 1511 onto the substrate 110; and the area of the orthogonal projection of the third opening 1513 onto the substrate 110 may be smaller than the area of the orthogonal projection of the second opening 1512 onto the substrate 110.

Further, the organic light-emitting display panel 100 may also include a plurality of spacers 170 disposed between the pixel definition layer and the cathode layer. The orthogonal projection of a spacer 170 onto the pixel definition layer may be between the first opening 1511 and the third opening 1513. In particular, along the column direction, the spacer 170 may be disposed between the first opening 1511 and an adjacent third opening 1513. Further, along the row direction, the spacer 170 may also be disposed between the first opening 1511 and an adjacent third opening 1513. In one embodiment, through including the spacers 170, the anti-crashing ability of the display panel may be enhanced. In addition, the spacers 170 may actually increase the height of the sidewall of the first opening. Thus, the color drift of the organic light-emitting display panel at large viewing angles may be improved.

For the pixel distribution approach in the disclosed embodiments, the spacers may not need to be adjacent to the second opening. When the anti-crashing ability of the display panel is increased, the height of the sidewall of the first opening may be increased without affecting the second opening. Further, the area of the projection of the third opening on the substrate may be smaller than the area of the projection of the first opening and the area of the projection of the second opening on the substrate. Therefore, the distance between the first opening and the third opening may be increased, and the spacers may have a sufficient space between the first opening and the third opening. Accordingly, the color drift of the organic light-emitting display panel at large viewing angles may be further improved.

Figure 19:
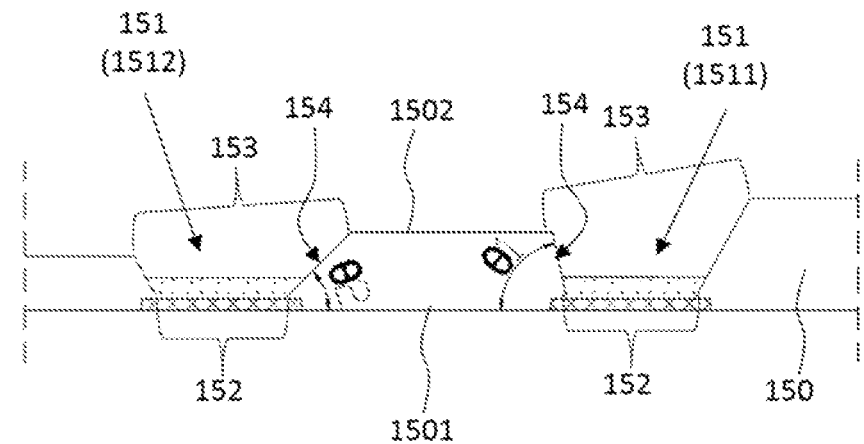
FIG. 19 illustrates an exemplary pixel definition layer of another exemplary organic light-emitting display panel consistent with various disclosed embodiments.

FIG. 19 illustrates another exemplary pixel definition layer of another exemplary organic light-emitting display panel consistent with various disclosed embodiments. As shown in FIG. 19, in one embodiment, an angle between the sidewall 154 of the first opening 1511 and the first bottom surface 1501 is θ1; and an angle between the sidewall 154 of the second opening 1512 and the first bottom surface 1501 is θ2, where θ1≤90° and θ2<90°. That is, the size of the top opening 153 of the first opening 1511 may not be smaller than the size of the bottom opening 152 of the first opening 1511; and the size of the top opening 153 of the second opening 1512 may be greater than the size of the bottom opening 152 of the second opening 1512. In particular, as shown in FIG. 19, the cross section of the first opening 1511 and the second opening 1513 may be inverted trapezoidal.

Further, θ1>θ2. That is, the inclining degree of the sidewall 154 of the second opening 1512 may be greater than the inclining degree of the sidewall 154 of the first opening 1511, or the slope angle of the sidewall 154 of the first opening 1511 may be greater than the slope angle of the sidewall 154 of the second opening 1512.

Further, the inclining degree of the sidewall of the opening of the pixel definition layer may be related to the brightness attenuation of the light emitted by the pixel. In one embodiment, red light of a longwave length and blue light of a short wavelength are taken as an example for further explanation.

Figure 20:
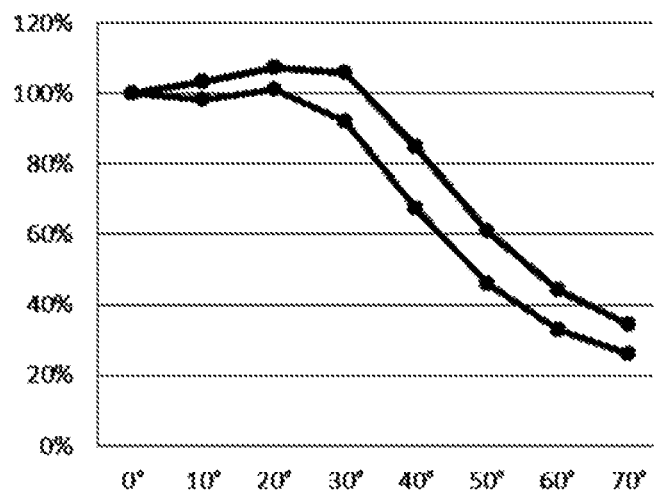
FIG. 20 illustrates a comparison of a viewing angle dependent brightness of a red pixel when an exemplary pixel definition layer has different inclining angles consistent with various disclosed embodiments.
Figure 21:
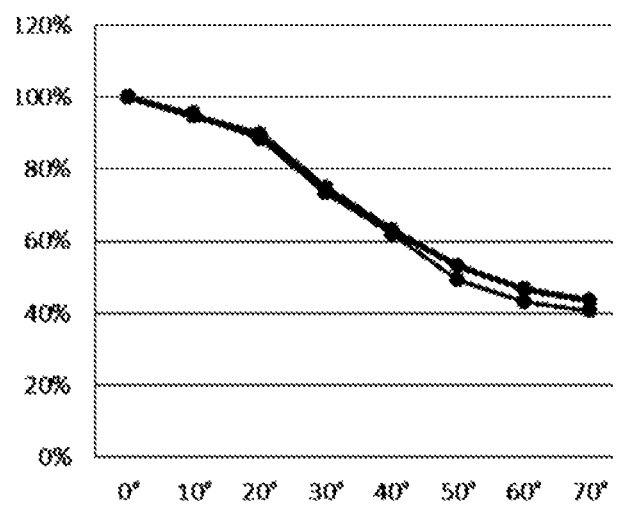
FIG. 21 illustrates a comparison of a viewing angle dependent brightness of a blue pixel when an exemplary pixel definition layer has different inclining angles consistent with various disclosed embodiments.

FIG. 20 illustrates a comparison between a viewing angle dependent brightness of a red pixel when the pixel definition layer has different inclining angles consistent with various disclosed embodiments; and FIG. 21 illustrates a comparison between a viewing angle dependent brightness of a blue pixel when the pixel definition layer has different inclining angles consistent with various disclosed embodiments. In FIG. 20, the inclining angles of the sidewalls of an opening of the pixel defining layer may be approximately 30° and 45°, respectively. In FIG. 21 the inclining angles of the sidewalls of an opening of the pixel defining layer may be approximately 30° and 45°, respectively. For ease of understanding, the specific numerical values of the representative points of the viewing angle dependent the brightness curves shown in FIG. 20 and FIG. 21 are summarized in Table 3 and Table 4, respectively. Table 3 illustrates the values of the representative points of the viewing angle dependent brightness of the red pixel; and Table 4 illustrates the values of the representative points of the viewing angle dependent brightness of the blue pixel.

TABLE 3

Values of the representative points of the viewing angle dependent brightness of the red pixel.

| | PDL inclining Angle of the Sidewall | |
|---|---|---|
| Viewing Angle | 30° | 45° |
| 0° | 100% | 100% |
| 10° | 98% | 103% |
| 20° | 101% | 107% |
| 30° | 92% | 106% |
| 40° | 67% | 85% |
| 50° | 46% | 61% |
| 60° | 33% | 44% |
| 70° | 26% | 34% |

TABLE 4

Values of the representative point of the viewing angle dependent brightness curve of the blue pixel.

| | PDL inclining Angle of the Sidewall | |
|---|---|---|
| Viewing Angle | 30° | 45° |
| 0° | 100% | 100% |
| 10° | 95% | 95% |
| 20° | 88% | 90% |
| 30° | 73% | 75% |
| 40° | 62% | 63% |
| 50° | 49% | 53% |
| 60° | 43% | 47% |
| 70° | 41% | 44% |

As shown in FIG. 20 and FIG. 21, when the inclining degree of the sidewall of the opening of the pixel defining layer is increased, i.e., as the inclining angle of the opening of the pixel defining layer is decreased, for example, the inclining angle of the opening of the pixel definition layer is decreased from approximately 45° to 30°, the trend of the viewing angle dependent brightness curve becomes steeper. That is, at a large viewing angle, as the inclining angle of the opening of the pixel definition layer is decreased, the brightness attenuation degree of the light may be increased.

Thus, in the disclosed embodiments, through making the inclining angle of the sidewall of the first opening to be greater than the inclining angle of the sidewall of the second opening, light of a long wavelength and a large brightness attenuation at large viewing angles may be compensated for a certain level. That is, the difference between of the brightness attenuation of the light of a long wavelength and the brightness attenuation the light of a short wavelength at the large viewing angle may be compensated by the difference between the inclining angles of the sidewalls of the openings of the pixel definition layer. Thus, the color drift of the organic light-emitting display panel at the large viewing angle may be reduced.

Further, when the inclining degree of the sidewall of the opening of the pixel definition layer is increased, i.e., the size of the opening is decreased, the light may be easier to enter the pixel definition layer. Therefore, the light of a long wavelength and a large brightness attenuation at the large viewing angles may be scattered, refracted and reflected at the interface between the pixel definition layer and the layer below the pixel definition layer (anode, metal layer, etc.), and be dispersed to all directions. Thus, the brightness of the light of the long wavelength at large viewing angles may be increased; and the color drift of the display panel at the large viewing angle may be improved.

In addition, for a contact interface between the light-emitting material layer and the sidewall of the opening of the pixel definition layer, light may be incident from the light-emitting material layer into the pixel definition layer. That is, the light may incident from an optically dense medium into an optically loss medium. When the pixel definition layer has a small inclining angle and the incident angle of the light is substantially large, a total reflection may occur; and the light may be unable to enter the pixel definition layer. With the increase of the inclining angle of the sidewall of the opening of the pixel definition layer, the total reflection may disappear; and more light may enter the pixel definition layer. Moreover, when propagating inside the pixel definition layer, the light may be scattered, refracted and reflected at the interface between the pixel definition layer and the layers below the pixel definition layer (anode, or metal layer, etc.), and the light may be dispersed to all directions. Therefore, more light may be emitted toward oblique viewing angles/large viewing angles; and the brightness of the pixel at a large viewing angle may be increased; and the color drift of the display panel at large viewing angles may be reduced.

Further, as illustrated in FIG. 19, the first top surface 1502 may be parallel to the first bottom surface 1501. The thickness of the pixel defining layer 150 between the first opening 1511 and the second opening 1512 may be smaller than the thickness of the pixel defining layer 150 at a second side of the first opening 1511 (i.e., a side of the first opening far away from the second opening 1512); and the thickness of the pixel defining layer 150 between the first opening 1511 and the second opening 1512 may be greater than the thickness of the pixel defining layer 150 at the second side of the second opening 1512 (i.e., a side of the second opening away from the first opening 1511).

That is, the effect of the height of the sidewall 154 at the first side of the first opening 1511 for reducing the color drift of the display panel may be weaker than the effect of the height of the sidewall 154 at the second side of the first opening 1511 for reducing the color drift of the display panel. In the present disclosed embodiment, the inclining degree of the sidewall 154 at the first side of the first opening 1511 may be increased. Thus, under the premise that the height of the sidewall desires to meet other requirements and may not be changed, the anti-color shift ability of the display panel at large viewing angles may be further improved by adjusting the inclining degree of the sidewall of the opening.

In particular, the inclining degree of the sidewall 154 at the first side of the first opening 1511 may be greater than the inclining degree of the sidewall 154 at the second side of the first opening 1511. Thus, the second opening 1512 may not be affected; and the ability of the first opening 1511 for preventing the color drift of the organic light-emitting display panel at the large viewing angle may be further improved. By adjusting the inclining degree of a portion of the sidewall of the opening, the ability of the first opening for preventing the color drift at large viewing angles may be further improved, and the ability of the sidewall in all directions of the first opening for reducing the color drift at large viewing angles may also be maintained uniform. By improving the uniformity of the performance in preventing the color drift at the large viewing angles, the color drift in various directions may be reduced; and different degrees of improvement in the color drift under different viewing angles may also be avoided.

The design of the sidewall of the first opening is only used as an example herein. In certain embodiments of the present disclosure, the second openings and the third openings may also be designed in accordance with the above-mentioned principles and methods.

Figure 22:
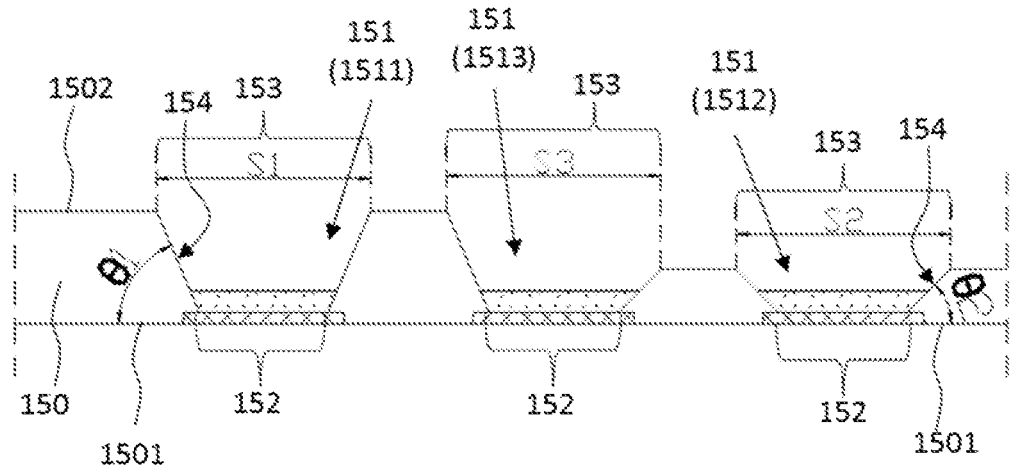
FIG. 22 illustrates an exemplary pixel definition layer of another exemplary organic light-emitting display panel consistent with various disclosed embodiments.

FIG. 22 illustrates another exemplary pixel definition layer of another exemplary organic light-emitting display panel consistent with various disclosed embodiment. The details of the pixel definition layer similar to the previous embodiments will not described herein.

As shown in FIG. 22, in one embodiment, the size of the bottom opening 152 of the first opening 1511 may be the same as the size of the bottom opening 152 of the second opening 1512. Thus, the area of the organic light-emitting material layer in the first opening that is in direct contact with the anode may be equal to the area of the organic light-emitting material layer in the second opening that is in direct contact with the anode; and the contact properties of the organic light-emitting material layer with the anode in the first opening and the second opening may be consistent. Accordingly, the luminous ability of the light-emitting material layer may be uniform.

In one embodiment, the angle between the sidewall 154 of the first opening 1511 and the first bottom surface 1501 is $\theta1$; and the angle between the sidewall 154 of the second opening 1512 and the first bottom surface 1501 is $\theta2$, where $\theta1 \leq 90°$ and $\theta2 < 90°$. That is, the inclining degree of the sidewall 154 of the second opening 1512 may be greater than the inclining degree of the sidewall 154 of the first opening 1511.

In one embodiment, the sidewalls 154 of the second openings 1512 may have a same inclining degree in each cross section, and the sidewalls 154 of the first opening 1511 may have a same inclining degree in each cross section. The reduced degree of the color drift by the sidewall located in each direction of the opening may be uniform; and the performance uniformity for preventing the color drift at large viewing angles may be improved; and the visual color drift in various directions may be reduced.

According to the design provided in the disclosed embodiments, the difference in aperture ratios caused by different heights of the sidewalls may be compensated by causing the inclining degree of the sidewall of the first opening to be smaller than the inclining degree of the sidewall of the second opening. Specifically, when θ1<90° and θ2<90°, the size of the top opening may be increased as the height of the sidewall of the opening is increased. Because the size of the bottom opening of the first opening may be equal to the size of the bottom opening of the second opening, when the height of the sidewall of the first opening is greater than the height of the sidewall of the second opening, the top opening of the first opening may be greater than the top opening of the second opening. Accordingly, the uniformity of the pixel aperture ratio may be affected. However, the disclosed embodiments may ensure that the top opening of the first opening and the top opening of the second opening to be the same. Thus, the color drift of the display panel at the large viewing angles may be reduced by adjusting the inclining degree of the sidewall of the opening. Meanwhile, the pixel aperture ratios of different colors may also be maintained the same.

Figure 23:
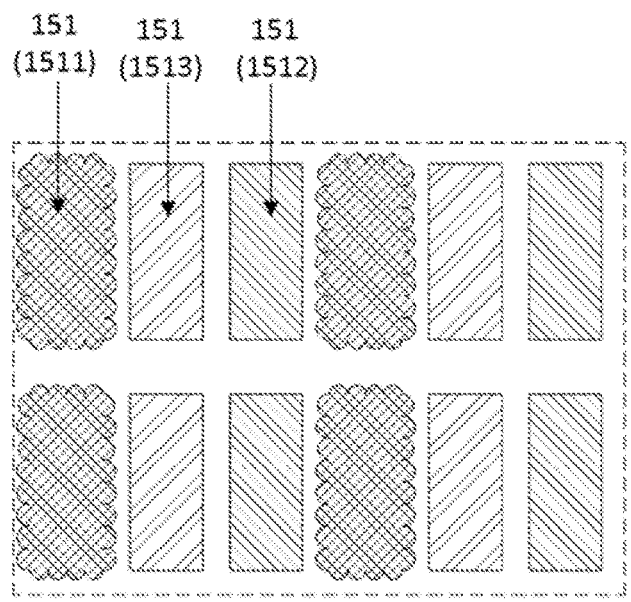
FIG. 23 illustrates a top view of another exemplary organic light-emitting display panel consistent with various disclosed embodiments.

FIG. 23 illustrates a top view of another exemplary organic light-emitting display panel consistent with various disclosed embodiments. The details of the disclosed embodiments similar with the previous embodiments will not be described herein.

As shown in FIG. 23, comparing with previous embodiments, the major difference may include the side of an orthogonal projection of the first opening onto the substrate may be non-linear. That is, the sidewall of the first opening may be a concave-convex surface. The side of the orthogonal projection of the second opening onto the substrate may be linear. That is, the sidewall of the second opening may be smooth. In one embodiment, the side of the orthogonal projection of the first opening onto the substrate is a polyline or a wavy line. Accordingly, the degree of the light emitted by the organic light-emitting material layer in the first opening refracted, reflected, and scattered by the pixel defining layer may be increased; and the area of the sidewall of the first opening may be increased. Therefore, light of a long wavelength may have more chance to enter the pixel definition layer; and the light of the long wavelength may be fully scattered, refracted and reflected. The proportion of light of the long wavelength at large viewing angles may be increased. Meanwhile, the contact interface between the sidewall of the first opening and the thin film encapsulation layer may be increased. Further, the compactness of the thin encapsulation layer be increased; and the peeling off of the thin encapsulation layer due to excessively high sidewalls of the first opening and the steep scale may be prevented.

Figure 24:
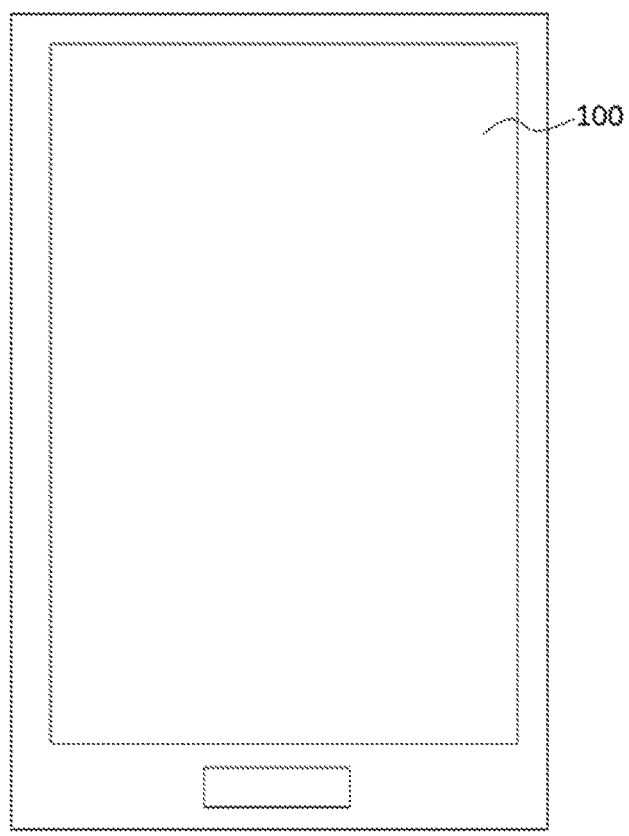
FIG. 24 illustrates an exemplary display apparatus consistent with various disclosed embodiments.

This present disclosure also provides a display apparatus with suppressed color shift at the large viewing angle. The display apparatus may include a disclosed organic light-emitting display panel, or other appropriated display panels. FIG. 24 illustrates an exemplary display apparatus consistent with various disclosed embodiments.

As shown in FIG. 24, the display apparatus 1000 may include an organic light-emitting display panel 100. The organic light-emitting display panel 100 may be a disclosed organic light-emitting display panel. For illustrative purposes, as shown in FIG. 24, a cell phone is use as an example to describe the display apparatus 1000. In another embodiment, the display apparatus may be other appropriate display apparatus having a display function, such as a computer, a television, or an on-board display device, etc. The type of the display apparatus is not limited by the present disclosure. The disclosed display apparatus may have the benefits of the disclosed display panel. For example, the display apparatus may significantly reduce the color drift of the displayed image at large viewing angles. The details may be referred to the specific descriptions of the disclosed display panels; and will not be repeated herein.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. An organic light-emitting display panel, comprising:
   a substrate;
   an array layer disposed on the substrate, wherein the array layer has a first surface facing the substrate and an opposing second surface far away from the substrate;
   a display layer disposed on the second surface of the array layer; and
   a thin film encapsulation layer disposed on a side of the display layer away from the array layer,
   wherein:
   the display layer comprises an anode layer having a first surface facing the array layer and an opposing second surface far away from the array layer, a pixel definition layer having a plurality of openings exposing the anode layer and disposed on the second surface of the array layer, an organic light-emitting material layer filled in the openings and having a first surface in contact with the anode layer and an opposing second surface far away from the anode layer, and a cathode layer disposed on the second surface of the organic light-emitting material layer;
   the plurality of openings of the pixel definition layer includes a plurality of first openings and a plurality of second openings;
   the organic light-emitting material layer filled in a first opening emits light of a first color;
   the organic light-emitting material layer filled in a second opening emits light of a second color;
   a wavelength of the light of the first color is greater than a wavelength of the light of the second color;
   along a direction perpendicular to the organic light-emitting display panel, a height of at least a portion of a sidewall surrounding the first opening is greater than a height of at least a portion of a sidewall surrounding the second opening; and
   the thin film encapsulation layer includes a bottom encapsulation layer surface facing the substrate, the bottom encapsulation layer surface includes a first portion filled into the first opening, a second portion filled into the second opening and a third portion without being filled into a third opening, and a drop between the first portion and the third portion is greater than a drop between the second portion and the third portion.

2. The organic light-emitting display panel according to claim 1,
   wherein:
   a sidewall of at least one opening of the plurality of openings has at least two different values of height at two different portions of the sidewall surrounding the at least one opening, wherein a height of the sidewall of the at least one opening is an average height and the average height is an average of the at least two different values of height.

3. The organic light-emitting display panel according to claim 1,
wherein the pixel definition layer includes a first bottom surface adjacent to the array layer and a first top surface far away from the array layer, and the plurality of openings further comprises:
a plurality of third openings,
wherein:
the organic light-emitting material layer filled in a third opening emits light of a third color;
a wavelength of the light of the third color is greater than the wavelength of the light of the second color and smaller than the wavelength of the light of the first color; and
an average height of a sidewall surrounding the third opening is greater than an average height of the sidewall surrounding the second opening and smaller than an average height of the sidewall surrounding the first opening.

4. The organic light-emitting display panel according to claim 3, wherein:
the light of the first color is red light;
the light of the second color is blue light; and
the light of the third color is green light.

5. The organic light-emitting display panel according to claim 3, wherein:
along a first direction and a second direction, the plurality of openings are arranged in a matrix;
the first direction crosses the second direction;
along the first direction, the first openings are adjacently distributed, the second openings are adjacently distributed, and the third openings are adjacently distributed; and
along the second direction, the first openings, the second openings and the third openings are alternately distributed.

6. The organic light-emitting display panel according to claim 5, further comprising:
at least one spacer disposed between the pixel definition layer and the cathode,
wherein an orthogonal projection of the at least one spacer onto the pixel definition layer is between two adjacent first openings and/or between the first opening and an adjacent third opening.

7. The organic light-emitting display panel according to claim 5, wherein:
in at least one first cross section of the organic light-emitting display panel, the first top surface is parallel to the first bottom surface;
between the first opening and an adjacent third opening, a distance between the first top surface and the first bottom surface is D1;
between the second opening and the third opening, a distance between the first top surface and the first bottom surface is D2; and
D1>D2,
wherein the first cross section is perpendicular to the organic light-emitting display panel and parallel to the second direction.

8. The organic light-emitting display panel according to claim 5, wherein:
in at least one second cross section of the organic light-emitting display panel, the first top surface is not parallel to the first bottom surface;
along a direction from the second opening to the first opening, the first top surface inclines in a direction far away from the first bottom surface; and
between the first opening and the second opening and/or between the second opening and the third opening, at least the portion of the first top surface is parallel to the first bottom surface,
wherein the second cross section is perpendicular to the organic light-emitting display panel and parallel to the second direction.

9. The organic light-emitting display panel according to claim 3, wherein:
along a row direction and a column direction, the plurality of openings are as arranged in a matrix;
the row direction is perpendicular to the column direction;
the plurality of openings are divided into a plurality of first column units and a plurality of second column units;
along the column direction, a first column unit includes alternately distributed first openings and third openings;
along the column direction, a second column unit includes alternately distributed second openings and third openings;
along the row direction, the first column units and the second column units are alternately distributed; and
along the row direction, the first openings and the third openings are alternately distributed, and the second openings and the third openings are alternately distributed.

10. The organic light-emitting display panel according to claim 9, wherein:
in at least one third cross section of the organic light-emitting display panel in which the at least one third cross section is passing through the first column unit, the first top surface is parallel to the first bottom surface;
a distance between the first top surface and the first bottom surface is D3;
in at least one fourth cross section of the organic light-emitting display panel in which the at least one fourth cross section is passing through the first column unit, the first top surface is parallel to the first bottom surface;
a distance between the first top surface and the first bottom surface is D4; and

D3>D4, wherein the third cross section and the fourth cross section are both perpendicular to the organic light-emitting display panel, and parallel to the column direction.

11. The organic light-emitting display panel according to claim 10,
wherein:
an area of an orthogonal projection of the third opening onto the array layer is smaller than an area of an orthogonal projection of the first opening onto the array layer; and
the area of the orthogonal projection of the third opening onto the array layer is smaller than an area of an orthogonal projection of the second opening onto the array layer.

12. The organic light-emitting display panel according to claim 1,
wherein:
the pixel definition layer includes a first bottom surface adjacent to the array layer and a first top surface far away from the layer;

an opening includes a bottom opening at the first bottom surface and a top opening at the first top surface;

along the direction perpendicular to the organic light-emitting display panel, a drop between the top opening of at least the portion of the sidewall surrounding the first opening and a surface of the organic light-emitting material layer is h1;

along the direction perpendicular to the organic light-emitting display panel, a drop between the top opening of at least the portion of the sidewall surrounding the second opening and the surface of the organic light-emitting material layer is h2; and $h1 \geq h2$.

13. The organic light-emitting display panel according to claim 1,
wherein:
the pixel definition layer includes a first bottom surface adjacent to the array layer and a first top surface far away from the array layer;
an opening includes a bottom opening at the first bottom surface and a top opening at the first top surface; and
the first top surface is continuous beyond the top opening.

14. The organic light-emitting display panel according to claim 1, further comprising:
at least one spacer disposed between the pixel definition layer and the cathode,
wherein an orthogonal projection of the at least one spacer onto the pixel definition layer is adjacent to the first opening.

15. The organic light-emitting display panel according to claim 1,
wherein:
the pixel definition layer includes a first bottom surface adjacent to the array layer and a first top surface away from the array layer;
an opening includes a bottom opening at the first bottom surface and a top opening at the first top surface;
an angle between the sidewall of the first opening and the first bottom surface is θ1;
an angle between the sidewall of the second opening and the first bottom surface is θ2; and

θ2<θ1≤90°.

16. The organic light-emitting display panel according to claim 15,
wherein:
a size of a bottom opening of the first opening is same as a size of a bottom opening of the second opening.

17. The organic light-emitting display panel according to claim 1,
wherein:
a side of an orthogonal projection of the first opening on the array layer is one of a polyline and a wavy line.

18. A display apparatus, comprising:
an organic light-emitting display panel,
wherein the organic light-emitting display panel comprises:
a substrate;
an array layer disposed on the substrate, wherein the array layer has a first surface facing the substrate and an opposing second surface;
a display layer disposed on the second surface of the array layer; and
a thin film encapsulation layer disposed on a side of the display layer away from the array layer,
wherein:
the display layer comprises an anode layer having a first surface facing the second surface of the array layer and an opposing second surface, a pixel definition layer having a plurality of openings exposing the anode layer and disposed on the second surface of the array layer, an organic light-emitting material layer filled in the openings and having a first surface in contact with the anode layer and an opposing second surface far away from the anode layer, and a cathode layer disposed on the second surface of the organic light-emitting material layer;
the plurality of openings of the pixel definition layer includes a plurality of first openings and a plurality of second openings;
the organic light-emitting material layer filled in a first opening emits light of a first color;
the organic light-emitting material layer filled in a second opening emits light of a second color;
a wavelength of the light of the first color is greater than a wavelength of the light of the second color;
along a direction perpendicular to the organic light-emitting display panel, a height of at least a portion of a sidewall surrounding the first opening is greater than a height of at least a portion of a sidewall surrounding the second opening; and
the thin film encapsulation layer includes a bottom encapsulation layer surface facing the substrate, the bottom encapsulation layer surface includes a first portion filled into the first opening, a second portion filled into the second opening and a third portion without being filled into a third opening, and a drop between the first portion and the third portion is greater than a drop between the second portion and the third portion.

19. An organic light-emitting display panel, comprising:
a substrate;
an array layer disposed on the substrate, wherein the array layer has a first surface facing the substrate and an opposing second surface far away from the substrate;
a display layer disposed on the second surface of the array layer; and
a thin film encapsulation layer disposed on a side of the display layer away from the array layer,
wherein:
the display layer comprises an anode layer having a first surface facing the array layer and an opposing second surface far away from the array layer, a pixel definition layer having a plurality of openings exposing the anode layer and disposed on the second surface of the array layer, an organic light-emitting material layer filled in the openings and having a first surface in contact with the anode layer and an opposing second surface far away from the anode layer, and a cathode layer disposed on the second surface of the organic light-emitting material layer;
the pixel definition layer includes a first bottom surface adjacent to the array layer and a first top surface far away from the array layer, the first top surface is not parallel to the first bottom surface, and along at least a direction from the second opening to the first opening, the first top surface inclines toward the first bottom surface;
the plurality of openings of the pixel definition layer includes a plurality of first openings and a plurality of second openings, the organic light-emitting material layer filled in a first opening emits light of a first color, the organic light-emitting material layer filled in a second opening emits light of a second color, and a wavelength of the light of the first color is greater than a wavelength of the light of the second color;

along a direction perpendicular to the organic light-emitting display panel, a height of at least a portion of a sidewall surrounding the first opening is greater than a height of at least a portion of a sidewall surrounding the second opening; and along the direction perpendicular to the organic light-emitting display panel, an inclining distance of the first top surface inclining in a direction far away from the first bottom surface is smaller than a thickness of the thin film encapsulation layer.

* * * * *